United States Patent [19]

Agrawal et al.

[11] Patent Number: 5,789,939
[45] Date of Patent: *Aug. 4, 1998

[54] METHOD FOR PROVIDING A PLURALITY OF HIERARCHICAL SIGNAL PATHS IN A VERY HIGH-DENSITY PROGRAMMABLE LOGIC DEVICE

[75] Inventors: Om P. Agrawal, Los Altos; Bradley A. Sharpe-Geisler, San Jose, both of Calif.

[73] Assignee: Advanced Micro Devices, Inc., Sunnyvale, Calif.

[*] Notice: The term of this patent shall not extend beyond the expiration date of Pat. No. 5,521,529.

[21] Appl. No.: 653,186

[22] Filed: May 24, 1996

Related U.S. Application Data

[63] Continuation of Ser. No. 459,960, Jun. 2, 1995, Pat. No. 5,521,529.

[51] Int. Cl.$^6$ ................ H03K 19/082; H03K 19/173
[52] U.S. Cl. ................ 326/41; 326/39; 326/38
[58] Field of Search ................ 326/41, 40, 39, 326/38; 340/826, 827

[56] References Cited

U.S. PATENT DOCUMENTS

| | | | |
|---|---|---|---|
| 4,758,746 | 7/1988 | Birkner et al. | 326/39 |
| 4,789,951 | 12/1988 | Birkner et al. | 326/39 |
| 5,130,574 | 7/1992 | Shen et al. | 326/39 |
| 5,191,243 | 3/1993 | Shen et al. | 326/39 |
| 5,204,556 | 4/1993 | Shankar | 326/41 |
| 5,220,214 | 6/1993 | Pedersen | 326/39 |
| 5,258,668 | 11/1993 | Cliff et al. | 326/39 |
| 5,260,610 | 11/1993 | Pedersen et al. | 326/39 |
| 5,260,611 | 11/1993 | Cliff et al. | 326/39 |
| 5,341,044 | 8/1994 | Ahanin et al. | 326/39 |
| 5,371,422 | 12/1994 | Patel et al. | 326/41 |
| 5,376,844 | 12/1994 | Pedersen et al. | 326/41 |
| 5,394,033 | 2/1995 | Tsui et al. | 326/41 |
| 5,521,529 | 5/1996 | Agrawal et al. | 326/41 |
| 5,552,722 | 9/1996 | Kean | 326/41 |

FOREIGN PATENT DOCUMENTS 0 584 911  3/1994  European Pat. Off.

OTHER PUBLICATIONS

Publication entitled "A High Performance FPGA with Hierarchical Interconnection Structure", 1994 *IEEE International Symposium on Circuits and Systems*, London May 30–Jun. 2, 1994, vol. 4 of 6, 30 May 1994, Institute of Electrical and Electronics Engineers, pp. 239–242.

*Primary Examiner*—Edward P. Westin
*Assistant Examiner*—Richard Roseen
*Attorney, Agent, or Firm*—Skjerven, Morrill, MacPherson, Franklin & Friel LLP; Edward C. Kwok

[57] ABSTRACT

A very high-density complex programmable logic device (CPLD) has a plurality of hierarchical signal paths. The lowest level of the hierarchy is independent from all higher levels. Similarly, an intermediate level is independent from all higher levels and utilizes only resources of the CPLD associated with the lowest and intermediate hierarchical levels. The first hierarchical level resources include a programmable logic block having a plurality of input lines and a plurality of output lines, and a programmable block switch matrix connected to the plurality of input lines of the programmable logic block. The second hierarchical level resources include a programmable segment switch matrix connected to a plurality of input lines of the programmable block switch matrix. The CPLD in addition includes a third hierarchical level circuit having third hierarchial level resources connected to the second hierarchical level resources where a third hierarchical level signal path utilizes the third, second, and first hierarchical level resources. The third hierarchical level resources include a programmable global switch matrix having global switch matrix lines programmably connected to and disconnected from lines of the programmable segment switch matrix.

12 Claims, 15 Drawing Sheets

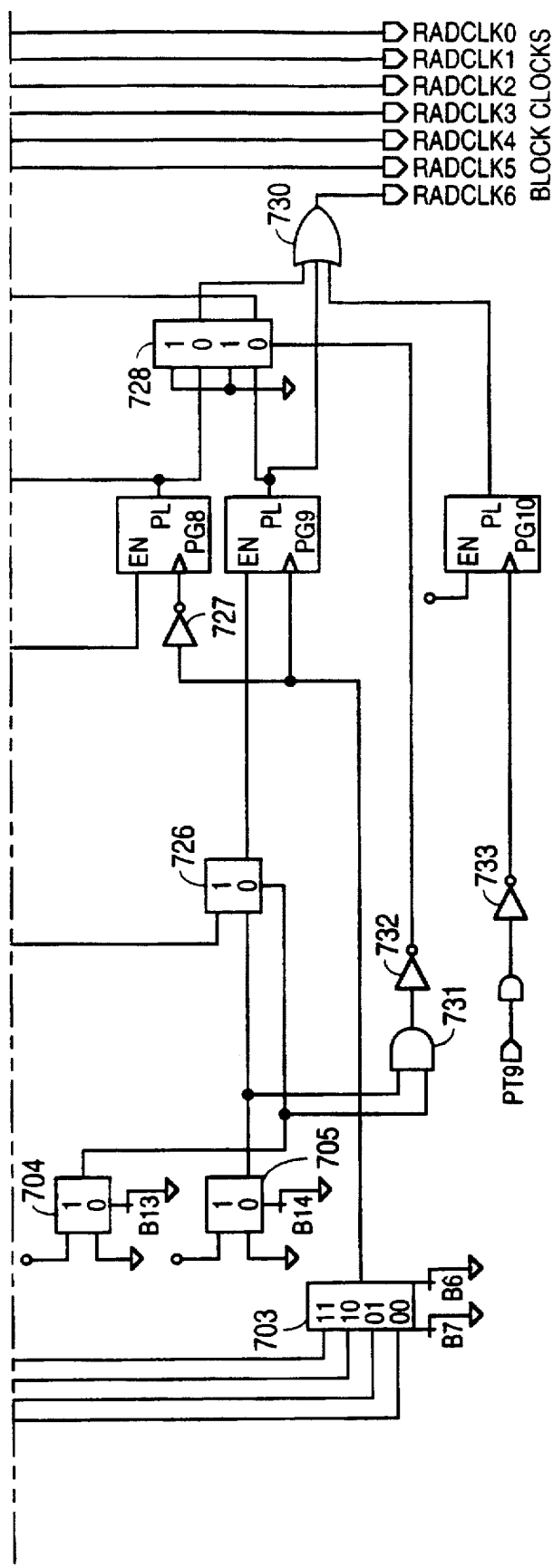

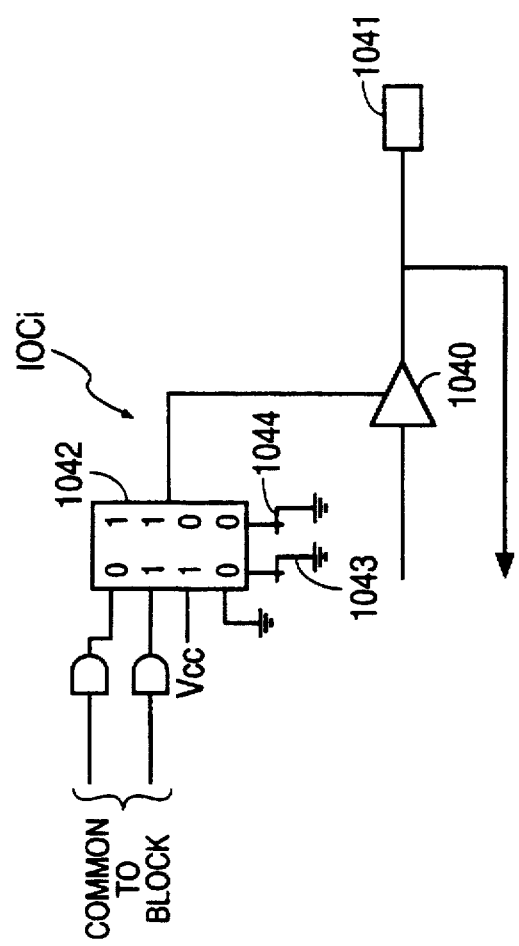

METHOD FOR PROVIDING A PLURALITY OF HIERARCHICAL SIGNAL PATHS IN A VERY HIGH-DENSITY PROGRAMMABLE LOGIC DEVICE

RELATED APPLICATION

This application is a continuation of U.S. patent application Ser. No. 08/459,960 entitled "A Very High-Density Complex Programmable Logic Device with a Multi-Tiered Hierarchical Switch Matrix and Optimized Flexible Logic Allocator" of Om P. Agrawal et al. filed on Jun. 2, 1995 which issued as U.S. Pat. No. 5,521,529 effective May 28, 1996.

BACKGROUND OF THE INVENTION

1. Field of the Invention

This invention relates generally to complex programmable logic devices and in particular to very high-density programmable logic devices with a high speed, hierarchical, scalable, multi-tiered switch matrix structure, optimized and flexible logic allocation, and a novel logic macrocell.

2. Description of Related Art

Architecture plays a crucial role for high-density, high performance programmable logic devices (PLDs). Over the past few years, essentially two types of PLD architectures have emerged in the high-density programmable logic device arena, i.e., channeled array based field programmable gate arrays (FPGAs) and segmented block-based electrically erasable PLDs, sometimes known as complex PLDs (CPLDs).

Conceptually, both segmented block-based CPLDs and FPGAs are programmable blocks with programmable interconnects. The fundamental difference between the two is in the architecture of the basic programmable block and the programmable interconnect structure. Basic goals are same for both architectures—higher density, higher performance, broader application base, low cost, and easy to use solutions. However, the means used to achieve these goals and results are different. Each of the basic architectures has its own characteristics, strengths and weaknesses that emanates from the fundamental philosophy behind the architecture.

Channeled array based FPGA architectures are characterized as an array of a large number of narrow, granular blocks, usually look-up table based or multiplexer based logic, surrounded by a phalanx of uncommitted I/O blocks, and interconnected by distributed programmable interconnect structures. Segmented block-based CPLDs, on the other hand, are characterized as made up of a smaller number of large programmable logic blocks, that are usually sum-of-products based, interconnected by a centralized switch matrix or interconnect array.

Narrow granular blocks along with distributed interconnects inherently tend to have variable, non-uniform, path-dependent and somewhat unpredictable signal delays. Most channeled array based FPGAs typically exhibit such signal delay characteristics. Most segmented block-based CPLDs tend to have fixed, more predictable, uniform and path-independent signal delays.

There are two distinct interconnect approaches for segmented block-based CPLDs, i.e., (i) a full cross-point programmable interconnect array (PIA) and (ii) a multiplexer based, sparse switch matrix structure. The full cross-point programmable interconnect array (PIA) has the potential advantage of 100% global connectivity for all signals. All global signals are typically brought into a centralized interconnect array and the input signals for each programmable logic block in the CPLD are generated from this centralized array. Though the number of input signals for each block is a subset of the total number of global signals, each input signal can essentially be a function of all global signal sources at the same time. This global connectivity provides 100% connectivity and somewhat simplifies the "Routing" software. Also, since full global connectivity is always available, the routing software is not required to make any particularly intelligent decisions for routing signals.

The major disadvantages of the full cross-point PIA approach are speed degradation, a larger die size, scalability with increased density, and wasted resources. A high-density CPLD incorporating a full cross-point programmable interconnect array tends to be (and is likely to be) slower and more expensive than a comparable CPLD with an optimized sparsely populated switch matrix. Since the full cross-point PIA receives feedback signals from all the internal logic macrocells of all logic blocks and all I/O pin feedback signals, the total number of input signals to the PIA is directly proportional to the total number and size of the logic blocks, and the number of I/O pins in the CPLD. As the number of logic blocks and I/O pins increase, the total number of signals routed to the PIA tends to increase rapidly.

As the density is increased to larger pin-count and higher-density logic, the PIA overhead becomes quite significant. Very large programmable interconnect arrays are inherently "slow" and have the additional overhead of larger die area. While conceptually the same approach can be used for larger density devices, in reality the approach becomes very difficult to implement. Therefore, scalability to higher densities with the full cross-point PIA is questionable. Considering these limitations, it is not surprising that the PIA has been utilized primarily in smaller density CPLDs.

The other significant drawback of the PIA is its potential waste of significant resources. The number of input signals needed for a block is usually significantly smaller than the device's full capability. As a result, most of the signal paths remain unutilized.

While the PIA approach strives for flexibility, the multiplexer based sparse switch matrix approach focuses on speed, cost, optimized global connectivity, and die size. Like a PIA, the sparse central switch matrix receives input signals from all macrocells and I/O pins. All programmable logic block input signals, in turn, are derived from the sparse central switch matrix. However, each programmable logic block input line is judiciously connected to a subset of the total input lines of the sparse central switch matrix to provide optimized connectivity. Unlike the PIA approach, each programmable logic block input line is not connected to all input lines of the sparse central switch matrix. Rather, all the input lines of a programmable logic block combined have access to all signals on the input lines to the sparse central switch matrix.

The sparse central switch matrix approach tends to put some restrictions on the global connectivity. This approach provides particular combinations of input signals to a programmable logic block, and so restricts certain combinations of input signals. However, with an intelligently structured sparse central switch matrix, the global connectivity can be significantly enhanced and the routing restrictions can be significantly minimized.

The major benefits of the sparse central switch matrix approach are high speed and predictable delays. Since all signals go through the sparse central switch matrix, the signal time delays are typically fixed, uniform, predictable, and path-independent.

Two of the most critical parameters affecting the routability of a multiplexer based sparse central switch matrix are the number of input lines to each programmable logic block from the switch matrix and the multiplexer size. As the multiplexer size and the number of programmable logic block input lines increase, signal routability of the total device increases. Unfortunately, both a larger number of input lines and a larger multiplexer structure result in slower performance and a bigger die size. Hence, there is a significant challenge for intelligently structuring both the block input size and the multiplexer size.

A major potential drawback of the single-tiered sparse central switch matrix approach is scalability to higher density devices. The number of signals entering the sparse central switch matrix tends to increase linearly with the number of macrocells and I/O pins. Thus, as the density is increased, the capacitive load for driving all signals to a central switch matrix is significantly increased. Also, to provide decent routability, with the goal of providing optimized global connectivity, either the number of programmable logic block input lines or the multiplexer size needs to be increased rapidly, resulting in slower and potentially more expensive devices. As a result, higher-density, block-based CPLDs tend to be comparatively slower than lower-density block-based CPLDs.

In a prior art CPLD with 128 macrocells in eight programmable logic blocks, twenty-six programmable logic block input lines, and a 16:1 multiplexer based switch matrix were adequate to achieve optimized routability. Twenty-six input lines and a 16:1 multiplexer provide the ability to select the twenty-six programmable logic block input signals from a maximum of 416 different signals. For a device with 128 macrocell feedback signals and 64 I/O pin feedback signals, i.e., a total of 192 global feedback signals, this provides a maximum of 2.16 ways (416/192) of routing each signal.

In another prior art CPLD, the centralized switch matrix approach was extended to 256 macrocells with 128 I/Os in 16 programmable logic blocks. Each programmable logic block had 34 input lines and a 36:1 multiplexer based switch matrix for each block. This provided the ability to route a maximum of 1224 (34×36) signals. With 256 macrocells, 128 I/O pins, and 14 dedicated input pin feedbacks, i.e., a total 398 global signals, this provided slightly more than three ways (1224/398) for routing each signal. Routability in this device was significantly more than the other prior art devices. A drawback of the larger switch matrix structure is obviously slower speed and increased die size.

While simplicity, speed, and smaller die size are the major advantages of the multiplexer based switch matrix structure, the major limitations are limited programmable logic block input lines and multiplexer size. As the pin-count or the logic density is increased, providing optimal global connectivity with only a centralized switch matrix is difficult because the multiplexer size becomes increasingly larger to maintain routability, which in turn degrades speed for all signals and complicates layout of the silicon die. Consequently, migration of logic designs to higher density CPLDs is possible only if the penalties in speed and die size are acceptable. An interconnect architecture for very high-density CPLDs with good speed, good signal routability characteristics, and uniform, predictable, fixed and path independent time delays is currently unavailable.

SUMMARY OF THE INVENTION

According to the principles of this invention, a very high-density complex programmable logic device has a plurality of hierarchical signal paths. The lowest level of the hierarchy is independent from all higher levels. Similarly, an intermediate level is independent from all higher levels and utilizes only features of the CPLD associated with the lowest and intermediate hierarchical levels.

Specifically, the very high-density complex programmable logic device includes a first hierarchical level circuit having first hierarchical level resources where a first hierarchical level signal path within the first hierarchical level circuit utilizes only the first hierarchical level resources. The first hierarchical level resources include a programmable logic block having a plurality of input lines and a plurality of output lines, and a programmable block switch matrix connected to the plurality of input lines of the programmable logic block.

The CPLD also includes a second hierarchical level circuit having second hierarchial level resources connected to the first hierarchical level resources where a second hierarchical level signal path utilizes only second and first hierarchical level resources. The second hierarchical level resources include a programmable segment switch matrix connected to a plurality of input lines of the programmable block switch matrix, and also a plurality of programmable logic blocks grouped as a segment.

The CPLD of this invention in addition includes a third hierarchical level circuit having third hierarchial level resources connected to the second hierarchical level resources where a third hierarchical level signal path utilizes the third, second, and first hierarchical level resources. The third hierarchical level resources include a programmable global switch matrix having global switch matrix lines programmably connected to and disconnected from lines of the programmable segment switch matrix and includes a plurality of segments.

The first hierarchical level, which includes a programmable block switch matrix and a programmable logic block, is a high speed signal path for routing a signal from one I/O pin associated with the programmable logic block through the programmable block switch matrix and programmable logic block to another I/O pin associated with the programmable logic block. The signal path has a pin-to-pin time delay that is comparable with low-density programmable logic devices that are referred to as PAL devices. (PAL is a registered U.S. trademark of Advanced Micro Devices of Sunnyvale, Calif.) Moreover, the signal time delay through a block switch matrix is preferably fixed, uniform, deterministic, and predictable, i.e., is a characteristic of the hierarchical level.

An important aspect, as explained above, is that the time delay through the segment switch matrix preferably is also fixed, predictable, uniform, and deterministic, as is the time delay through the global switch matrix. Consequently, the time delay for the signal path in the second hierarchical level, e.g., from a pin associated with one programmable logic block through the segment switch matrix, the block switch matrix, and the programmable logic block back to another pin associated with that programmable logic block is also fixed, predictable, uniform, and deterministic time delay, and is a characteristic of the second hierarchical level. Alternatively, on the second hierarchical level, a signal from a first programmable logic block in a segment can be fed back through the segment switch matrix, a block switch matrix for a second programmable logic block and the second programmable logic block in the segment with the time delay characteristic of the second hierarchical level.

Also, a signal path from a programmable logic block in a first segment, or an I/O pin associated with the programmable logic block, to the segment switch matrix, to the global switch matrix, to another segment switch matrix, block switch matrix and programmable logic block in another segment, defines the third hierarchical level of the CPLD with a time delay characteristic of the third hierarchical level.

In this embodiment, a programmable logic block receives input signals over a plurality of input lines from a block switch matrix. The block switch matrix receives input signals from a plurality of segment switch matrix input lines and a predetermined number of local feedback lines from logic macrocells and from I/O pins in the programmable logic block. Thus, the block switch matrix arbitrates whether a programmable logic block receives first level or second level hierarchical signals.

The segment switch matrix has a plurality of lines connected to the global switch matrix and the predetermined number of local feedback lines from the logic macrocells and the I/O pins associated with each programmable logic block in the segment. Thus, the segment switch matrix arbitrates between routing a signal to the second hierarchical level, i.e. through the segment switch matrix to a block switch matrix, or to the third hierarchical level, i.e., through the segment switch matrix to the global switch matrix. In this embodiment, the global switch matrix receives input signals from each segment switch matrix in the CPLD and routes the signals to another segment switch matrix.

In one embodiment, each programmable logic block includes a programmable logic array, a programmable optimized-distribution logic allocator, and a plurality of programmable logic macrocells, a macrocell mode control generator circuit, and a plurality of I/O cells that each control the configuration of an I/O pin. In this embodiment, the programmable logic macrocells can be both output logic macrocells that are coupled to an I/O pin, or buried logic macrocells that only provide feedback signals to the hierarchical switch matrix. In another embodiment, all the programmable logic macrocells in one programmable logic block are output programmable logic macrocells and all the programmable logic macrocells in another programmable logic block are buried programmable logic macrocells.

In one embodiment, the programmable logic array is a programmable-AND fixed-OR logic array (AND/OR array). The programmable-AND array has a plurality of logic product terms and a plurality of control product terms. Each cluster of four product terms drives one OR gate in the fixed-OR gate array. In one embodiment, three of the four product terms are fixedly connected to the OR gate and one of the product terms is programmably connectable to and disconnectable from the OR gate. In another embodiment, all of the four product terms are fixedly connected to the OR gate.

The sum-of-product terms from an OR gate drives one input line in the plurality of input lines of the programmable optimized-distribution logic allocator. The programmable optimized-distribution logic allocator includes a multiplicity of router elements, where each router element steers a sum of a selected number of sum-of-product terms from the programmable array, i.e. a selected number of logic product-term clusters, to a programmably selected logic macrocell. Further, the router elements are configured to optimize the logic efficiency.

Specifically, the programmable optimized-distribution logic allocator provides programmable access to a minimum of twenty product terms to each logic macrocell. In addition, selected macrocells and I/O pins have programmable access to a greater logic depth so that logic functions requiring up to thirty-two product terms, i.e., one-half the total number of product terms available for logic, can be implemented in a single pass through the CPLD.

Hence, unlike the prior art PLDs that required a logic allocator and an output switch matrix to create a symmetric appearance at the I/O pins, the programmable optimized-distribution logic allocator provides programmable access to a uniform, symmetric distribution of twenty product terms to each of the I/O pins without an output switch matrix. Further, the feedback signals from the macrocells are uniform and symmetric for the twenty product terms.

The uniform and variable logic product-term cluster distribution of the programmable optimized-distribution logic allocator with the twenty product terms provides several major benefits. First, the need for "wrap-around" at the boundaries of the programmable logic array for better product-term allocation has been obviated. Second, the need for an output switch matrix between the logic macrocells and the I/O cells also has been obviated. Third, for certain logic macrocells up to thirty-two product terms are available without feedback, i.e., greater logic depth is available in a single pass through the CPLD.

Each logic macrocell in a programmable logic block receives a plurality of radical block clock signals from the macrocell mode control generator circuit. Herein, the signals from the macrocell mode control generator are referred to as radical block clock signals because the signals can include conventional clock signals as well as signals that configure a macrocell for a particular virtual mode of operation as a particular type of storage element.

The macrocell mode control generator circuit includes architectural cells that are used to configure the generator circuit to provide the plurality of radical block clock signals to each programmable logic macrocell in the programmable logic block. The radical block clock signals can include synchronous clock signals, asynchronous clock signals, and asynchronous preset and reset signals. The macrocell mode control generator circuit can be programmed to provide a dual edge-sensitive clock that clocks on both rising and falling edges. A macrocell can be clocked at twice the frequency of the external clock signal. Finally, the radical block clock signals also can include two clock signals from a single source that are exactly 180° out of phase with each other, or mixed clock signals that include combinations of sum-of-product term clocks, product-term clocks, and pin clocks.

In this embodiment, each programmable logic macrocell includes a programmable multiplexer that receives the plurality of radical block clock signals from the macrocell mode control generator circuit and a configurable storage element. The configurable storage element can be configured to provide a combinatorial output signal. An input terminal of the configurable storage element is coupled to an output line from the logic allocator and a configuration input/clock terminal of the configurable storage element is connected to the output line from the programmable multiplexer. The particular radical block clock signal passed through the programmable multiplexer by an input select signal determines the characteristics of the configurable storage element. The configurable storage element can be configured at least as any one of D-type flip-flop, a T-type register, a latch, and a combinatorial output signal. Thus, the signals generated by the programmable macrocell mode control generator circuit are used to customize each programmable logic macrocell in the programmable logic block.

While the functionality of the programmable macrocell of this invention is similar to that in prior art CPLDs, the implementation of the functionality using only a programmable multiplexer and a three-terminal configurable storage element is fundamentally different from prior art macrocells. In the prior art CPLDs, the registers and latches in the macrocell were thought of as storage elements with each storage element having a clock terminal, an asynchronous preset terminal, an asynchronous reset terminal, and possibly an enable terminal in addition to the input and output terminals. Typically, the signals used to drive the clock terminal, the asynchronous preset terminal, and the asynchronous reset terminal were either implemented using macrocell specific resources, e.g., a product-term from the cluster associated with the macrocell, or resources common to the programmable logic block containing the macrocell.

According to the principles of this invention, the preset, reset, and clock signals for a register or a latch are not independent from the partitioning process for a programmable logic block. The preset, reset and clock signals are combined into a radical block clock expression that is implemented by the programming macrocell mode control generator circuit.

In this embodiment, an output line from the logic macrocell drives a feedback line to the hierarchical switch matrix, and an input line to an I/O cell. In another embodiment, the programmable logic macrocells are divided into output logic macrocells and buried logic macrocells, as indicated above. The output logic macrocells function as just described. The buried logic macrocells only provide feedback signals to the hierarchical switch matrix.

Each I/O cell selectively connects and disconnects the programmable logic macrocell output signal to an I/O pin. In this embodiment, each I/O cell can be configured to connect the programmable logic macrocell output signal to the I/O pin, to tri-state the I/O pin, or to control the signal supplied to I/O pin with one of the two product terms that are common to all the I/O cells in the programmable logic block.

BRIEF DESCRIPTION OF THE DRAWINGS

FIG. 10 is a schematic diagram of one embodiment of an I/O cell for this invention.

DETAILED DESCRIPTION

In accordance with the principles of this invention, a new very high-density complex programmable logic device (CPLD) 100 includes a new hierarchical switch matrix 160 that programmably interconnects a multiplicity of programmable segments 101 to 104 that each includes a plurality of programmable logic blocks, e.g. in this embodiment four programmable logic blocks 101-A to 101-D, 102-A to 102-D, 103-A to 103-D, and 104-A to 104-D, respectively. In this embodiment, each of the programmable logic blocks is a 32V16-like programmable logic block that has thirty-two input lines, sixteen macrocells, and sixteen I/O pins.

Figure 1:
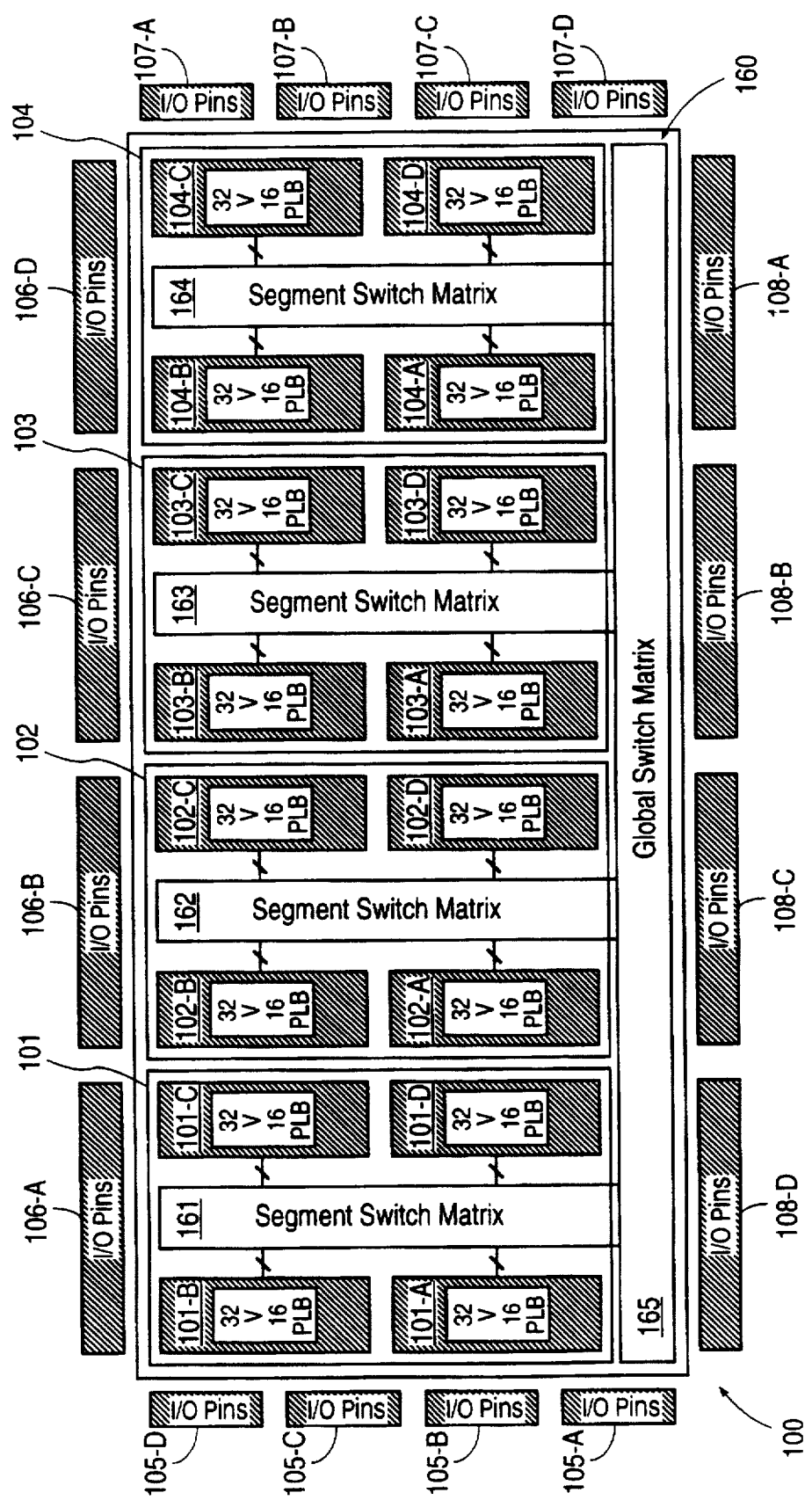
FIG. 1 is a block diagram of a very high-density programmable logic device (CPLD) including the hierarchical switch matrix of this invention.

Two levels of hierarchical switch matrix 160 are illustrated in FIG. 1, i.e., a plurality of programmable segment switch matrices 161 to 164, and a programmable global switch matrix 165. In another embodiment, as described more completely below, a plurality of block switch matrices is included in hierarchical switch matrix 160. The various levels of hierarchy in hierarchical switch matrix 160 and CPLD 100 are defined by the signal paths through CPLD 100. Each hierarchical signal path has a predetermined time delay associated with the path.

According to the principles of this invention, all programmable logic blocks within a segment communicate with each other through the programmable segment switch matrix, sometimes referred to as the segment switch matrix, for that segment. For example, programmable logic blocks 101-A to 101-D communicate with each other through segment switch matrix 161. Thus, the signal path through segment switch matrix 161 to programmable logic block 101-D defines a hierarchical level within PLD, e.g., intra-segment signal paths are one level of hierarchy.

Global switch matrix 165 programmably interconnects and disconnects segment switch matrices 161 to 165 so that signals can be communicated between programmable logic blocks in different segments. Thus, a programmable logic block in one segment communicates with a programmable logic block in another segment using programmable global switch matrix 165, sometimes referred to as global switch matrix 165. For example, programmable logic block 102-A in segment 102 drives a signal onto programmable segment switch matrix 162 which provides the signal to global switch matrix 165. Global switch matrix 165 routes the signal to segment switch matrix 161, which in turn provides the signal to programmable logic block 101-B. Thus a signal path through global switch matrix 165 to a segment switch matrix to a programmable logic block defines another level of hierarchy within CPLD 100.

Signal transfer through hierarchial switch matrix 160 is very rapid. Hierarchial switch matrix 160 provides numerous programmably selectable signal path combinations to each programmable logic block, and so has significant signal path flexibility.

Hierarchical switch matrix 160 has a fixed, path independent, uniform, predictable and deterministic time delay through each level of hierarchical switch matrix 160. Thus, the speed of CPLDs containing hierarchical switch matrix 160 is dependent on the signal path though hierarchical switch matrix 160, i.e. the number of levels of hierarchical switch matrix 160 traversed by the signal.

Each segment 101 to 104 in CPLD 100 is modular. As explained more completely below, the modularity results in significantly easier scalability to higher densities. Specifically, global switch matrix 165 is easily extended to support any number of segments with no change in the basic global switch matrix architecture. Each segment is completely independent and has its own programmable interconnect with global switch matrix 165.

Further, the modular segment architecture permits CPLD 100 to be configured as multiple independent CPLDs that are interconnected by global switch matrix 165. Consequently, instead of laying out a circuit board to support multiple CPLDs and routing the signals among the various CPLDs, CPLD 100 of this invention can be used. The replacement of the circuit board layout with the programmability of global switch matrix 165 greatly enhances the designer's ability to quickly and effectively implement changes. Consequently, CPLD 100 of this invention reduces the time-to-market of circuits utilizing two or more interconnected CPLDs.

Prior art CPLDs with a single-tier multiplexer-based switch matrix were optimized for speed with gate densities in the range of about 32 to 256 macrocells. According to the principles of this invention, hierarchical switch matrix 160 is suitable for CPLDs having gate densities in the range of about 64 to about 500 or more macrocells. Specifically, as used herein, "very high-density programmable logic device" refers to a CPLD having in the range of 64 to 512 or more macrocells and 64 to 256 or more I/O pins.

In FIG. 1, for clarity the specific coupling between the I/O pins and the programmable logic blocks in a segment is not illustrated. However, the pluralities of I/O pins 105-A to 105-D are coupled to programmable logic blocks 101-A to 101-D, respectively; the pluralities of I/O pins 106-A to 106-D are coupled to programmable logic blocks 102-A to 102-D, respectively; the pluralities of I/O pins 107-A to 107-D are coupled to programmable logic blocks 103-A to 103-D, respectively; and the pluralities of I/O pins 108-A to 108-D are coupled to programmable logic blocks 104-A to 104-D, respectively.

Unlike the prior art CPLDs with a single tier centralized sparse switch matrix that compromised logic flexibility for speed, hierarchial switch matrix 160 provides a new level of architectural flexibility and speed. Generally, in comparison to the prior art centralized sparse switch matrices, hierarchical switch matrix 160 provides increased signal routing flexibility and scalability to higher densities without encountering signal routing limitations.

A more detailed description of hierarchical switch matrix 160 is provided in copending, commonly filed, and commonly assigned U.S. patent application Ser. No. 08/459,230, entitled "A MULTI-TIERED HIERARCHICAL HIGH SPEED SWITCH MATRIX STRUCTURE FOR VERY HIGH-DENSITY COMPLEX PROGRAMMABLE LOGIC DEVICES" of Om P. Agrawal et al. that was filed on Jun. 2, 1995, and is incorporated herein by reference in its entirety.

Figure 2:
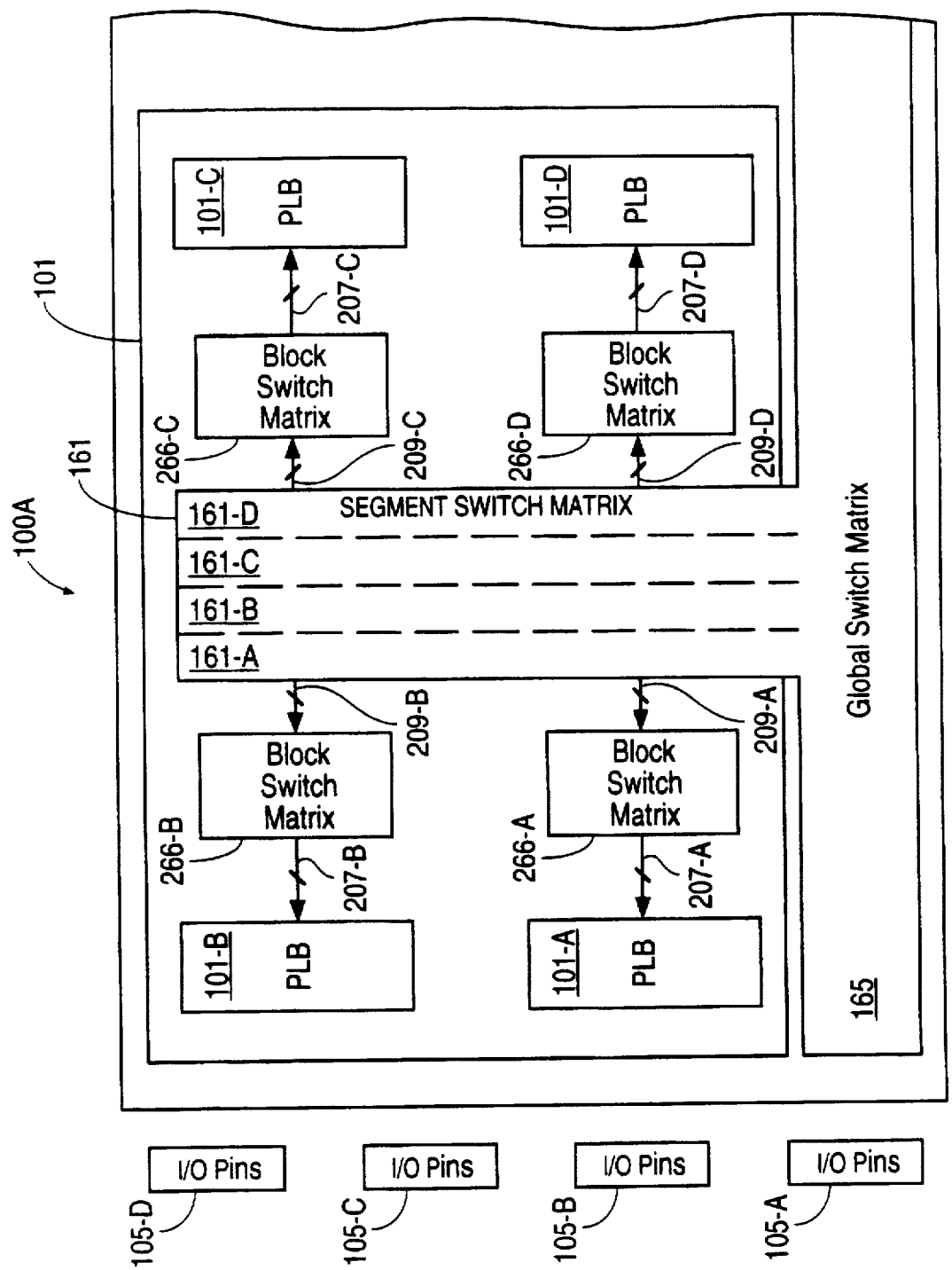
FIG. 2 is a more detailed block diagram of the CPLD of FIG. 1 that illustrates the global switch matrix, segment switch matrices, and the block switch matrices that comprise the hierarchical switch matrix of this invention.

FIG. 2 is a block diagram of one module, i.e., segment 101, of a very high-density CPLD 100A that includes both a three-level hierarchical switch matrix 160 and the programmable logic block of this invention. Hierarchical switch matrix 160, in this embodiment, includes global switch matrix 165, segment switch matrix 161, as well as each of the other segment switch matrices illustrated in FIG. 1, and a plurality of programmable block switch matrices that includes programmable block switch matrices 266-A to 266-D. In view of the modularity of the segments, only the portion of hierarchical switch matrix 160 that is associated with segment 101 is considered. The architecture of hierarchical switch matrix 160 for each of the other segments will be apparent to those skilled in the art in view of this disclosure.

As illustrated in FIG. 2, each programmable logic block 101-A to 101-D has associated with that programmable logic block a programmable block switch matrix 266-A to 266-D, respectively. Herein, elements with the same alphanumeric character in the reference numeral are associated elements. Programmable block switch matrices 266-A to 266-D are a first level within hierarchical switch matrix 160.

Each programmable block switch matrix, sometimes referred to as a block switch matrix, has a plurality of output lines that provide a plurality of input signals on input lines to the associated programmable logic block, e.g., output lines 207-A of block switch matrix 266-A provide input signals to input lines of programmable logic block 101-A. Each programmable block switch matrix 266-A to 266-D receives a plurality of input signals from segment switch matrix 161 over lines 209-A to 209-D, respectively. Each programmable block switch matrix also receives a plurality of feedback signals from the programmable logic blocks and I/O pins associated with the block switch matrix.

In one embodiment, as explained more completely below, each of a plurality of programmable logic macrocells in programmable logic block 101-A, e.g., sixteen programmable output logic macrocells, provide feedback signals to both block switch matrix 266-A (for fast local feedback path) and to segment switch matrix 161. All feedback signals of a programmable logic block 101-A, i.e., all I/O pins feedback signals, and all macrocell feedback signals, communicate directly only with block switch matrix 266-A and with segment switch matrix 161. For clarity the feedback signals are not shown in FIG. 2.

A programmable logic block 101-A and an associated block switch matrix 266-A define a first hierarchical level in CPLD 100A. A signal in CPLD 100 that is generated at this first hierarchical level can be fed back to the first hierarchical level independent of any other hierarchical levels in CPLD 100, i.e, a signal from programmable logic block 101-A can be fed back through block switch matrix 266-A to block 101-A. Also, a signal from an I/O pin can be passed through the first hierarchical level to another I/O pin associated with block 101-A independent of any other hierarchical levels in CPLD 100, i.e., from an I/O pin to block switch matrix 266-A to block 101-A to another I/O pin associated with block 101-A. Thus, one important aspect of this invention, is that a signal can traverse the first hierarchical level independent of any other hierarchical level in CPLD 100.

Thus, a programmable block switch matrix, e.g. block switch matrix 266-A, is a high speed programmable switch matrix for routing a signal from one I/O pin in I/O pins 105-A through programmable logic block 101-A to another I/O pin in I/O pins 105-A. The signal path has a pin-to-pin time delay that is comparable with low-density programmable logic devices that are referred to as PAL devices. (PAL is a registered U.S. trademark of Advanced Micro Devices of Sunnyvale, Calif.) Moreover, the signal time delay through a block switch matrix is preferably fixed, uniform, deterministic, and predictable, and is a characteristic of the hierarchical level.

An important aspect, as explained above, is that the time delay through segment switch matrix 161 preferably is also fixed, predictable, uniform, and deterministic, as is the time delay through global switch matrix 165. Consequently, the time delay for the signal path from a pin associated with one programmable logic block through segment switch matrix 161, block switch matrix 266-A, and programmable logic block 101-A back to another pin associated with that programmable logic block is also fixed, predictable uniform, and deterministic, and is characteristic of the second hierarchical level. Alternatively, on the second hierarchical level, a signal from a first programmable logic block 101-B can be fed back through segment switch matrix 161 and block switch matrix 266-A to programmable logic block 101-A with the time delay characteristic of the second hierarchical level.

Also, a signal from a programmable logic block 101-A in a first segment 101, or an I/O pin associated with programmable logic block 101-A, to segment switch matrix 161 to global switch matrix 165 to another segment switch matrix, block switch matrix and programmable logic block in another segment defines a third hierarchical level of CPLD 100 with a characteristic time delay of the third hierarchical level.

One important aspect of this embodiment of hierarchical switch matrix 160, that breaks routing congestion, is that none of the feedback signals from the macrocells and I/O pins connect directly to global switch matrix 165. These feedback signals communicate with global switch matrix 165 only via segment switch matrix 161. This architecture for hierarchical switch matrix 160 maintains the modularity of each segment and so is important to the scalability that can be obtained with hierarchical switch matrix 160.

As illustrated in FIG. 2, each segment switch matrix 161 includes a multiplicity of strips 161-A to 161-D, i.e., the multiplicity includes one strip for each programmable logic block in the segment. The lines in a strip are programmably connectable and disconnectable from the input lines to each block switch matrix 266-A to 266-D. Each strip, for example, strip 161-A, receives input signals only from the corresponding programmable logic block, e.g., programmable logic block 101-A, and programmably connects and disconnects the input signals to output lines of segment switch matrix 161. In this embodiment, each strip includes programmable 1:n demultiplexers that can provide each input signal up to n paths through segment switch matrix 161, as explained more completely below. The strip architecture of a segment switch matrix facilitates scaling a segment for various numbers of programmable logic blocks.

Figure 3:
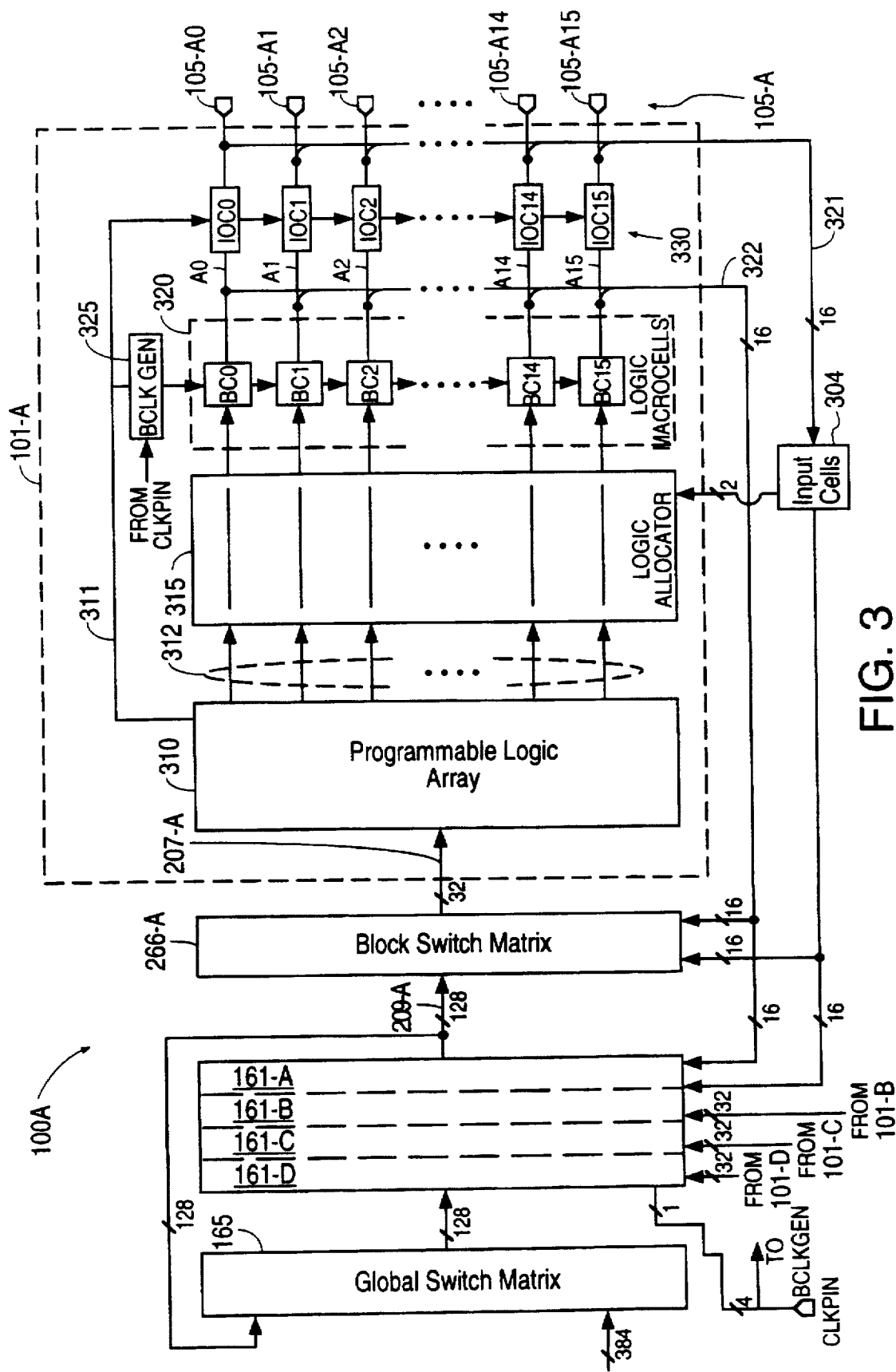
FIG. 3 is a detailed block diagram of the hierarchical switch matrix and the programmable logic block of this invention.

FIG. 3 is a more detailed block diagram of one embodiment of a CPLD 100A. In this embodiment, as described above, CPLD 100A includes a plurality of programmable logic blocks and each programmable logic block in CPLD 101A is similar to programmable logic block 101-A. Programmable logic block 101-A receives input signals over thirty-two input lines 207-A from block switch matrix 266-A. Block switch matrix 266-A receive 128 input signals from segment switch matrix 161 over input lines 209-A and a predetermined number of local feedback lines, e.g., sixteen feedback lines 322 from logic macrocells 320 and sixteen feedback lines 321 from I/O pins 105-A. Thus, block switch matrix 266-A arbitrates whether programmable logic block 101-A receives first level or second level hierarchical signals.

More specifically, feedback lines 321 carry the signals on I/O pins 105-A to input cells 304. Input cells 304 are simply a straight pass through so that the signals on feedback lines 321 are passed directly to block switch matrix 266-A and to segment switch matrix 161. In addition, one I/O pin drives a cell in input cells 304-A that passes one of (i) the signal on the one I/O pin; and (ii) a registered/latched output signal that is driven by the signal on the one I/O pin to an input line of logic allocator 315 in programmable logic block 101-A. Similarly, another I/O pin drives another cell in input cells 304 that passes one of (i) the signal on the another I/O pin; and (ii) a registered/latched output signal that is driven by the signal on the another I/O pin to another input line of logic allocator 315 in programmable logic block 101-A.

Segment switch matrix 161 has a predetermined number of input lines, e.g., 128 input lines, from global switch matrix 465; the predetermined number of local feedback lines, e.g., sixteen feedback lines 322 from logic macrocells 320 and sixteen feedback lines 321 from I/O pins 105-A to strip 161-A; and yet another predetermined number of input lines, e.g., ninety-six input lines, from other programmable logic blocks 101-B to 101-D within segment 101 to strips 161-B to 161-D, respectively. In FIG. 3, output lines 209-A from segment switch matrix 161 are bidirectional, but the input lines to block switch matrix 266-A that are driven by segment switch matrix 165 only provide signals to block switch matrix 266-A. Segment switch matrix 166 arbitrates between routing a signal to the second hierarchical level, i.e., through segment switch matrix 166 to block switch matrix 266-A, or to the third hierarchical level, i.e., through segment switch matrix 166 to global switch matrix 165.

Figure 4A:
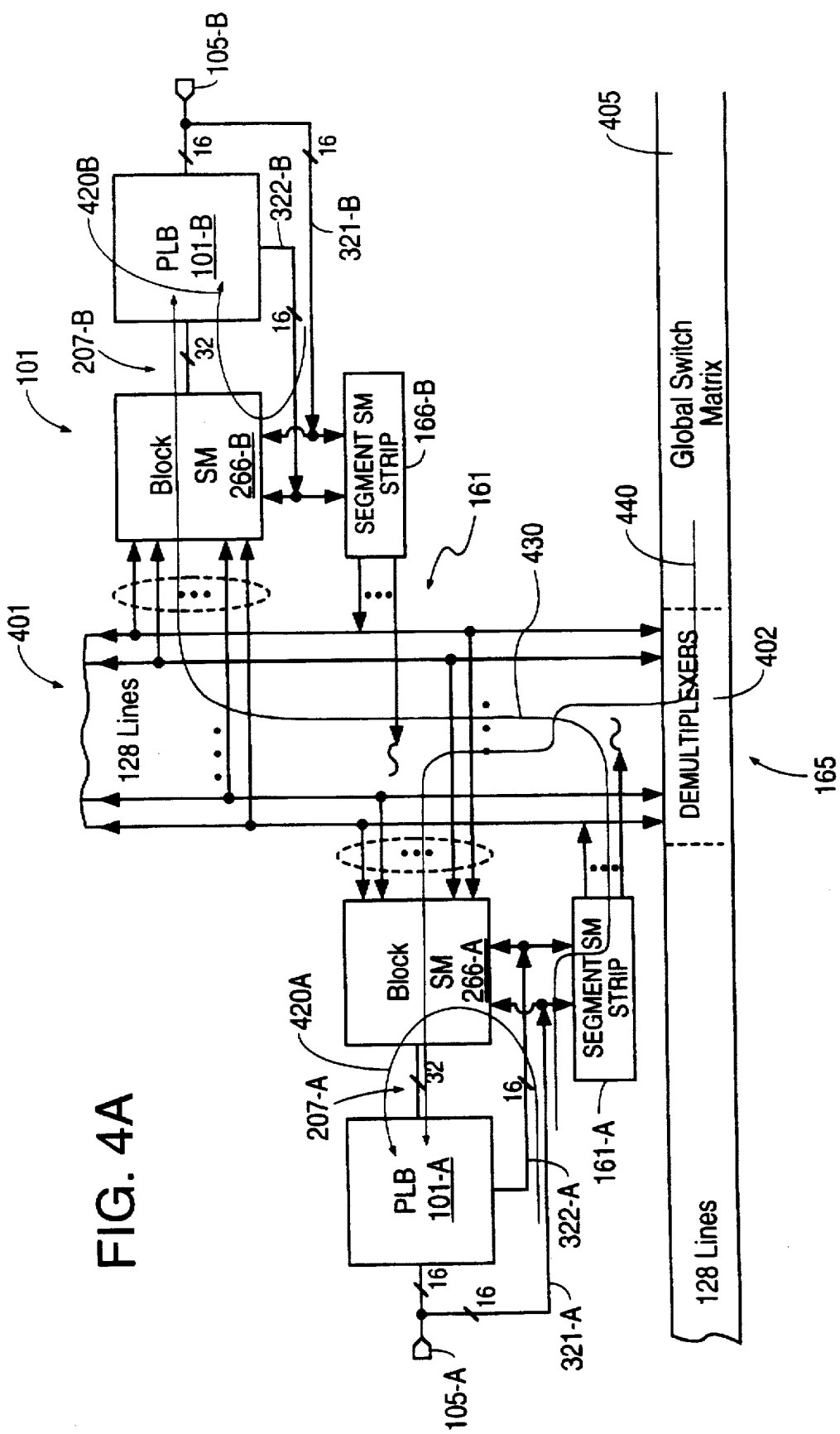
FIGS. 4A and 4B illustrate the programmable interconnect between the segment switch matrices and the global switch matrix of this invention.
Figure 4B:
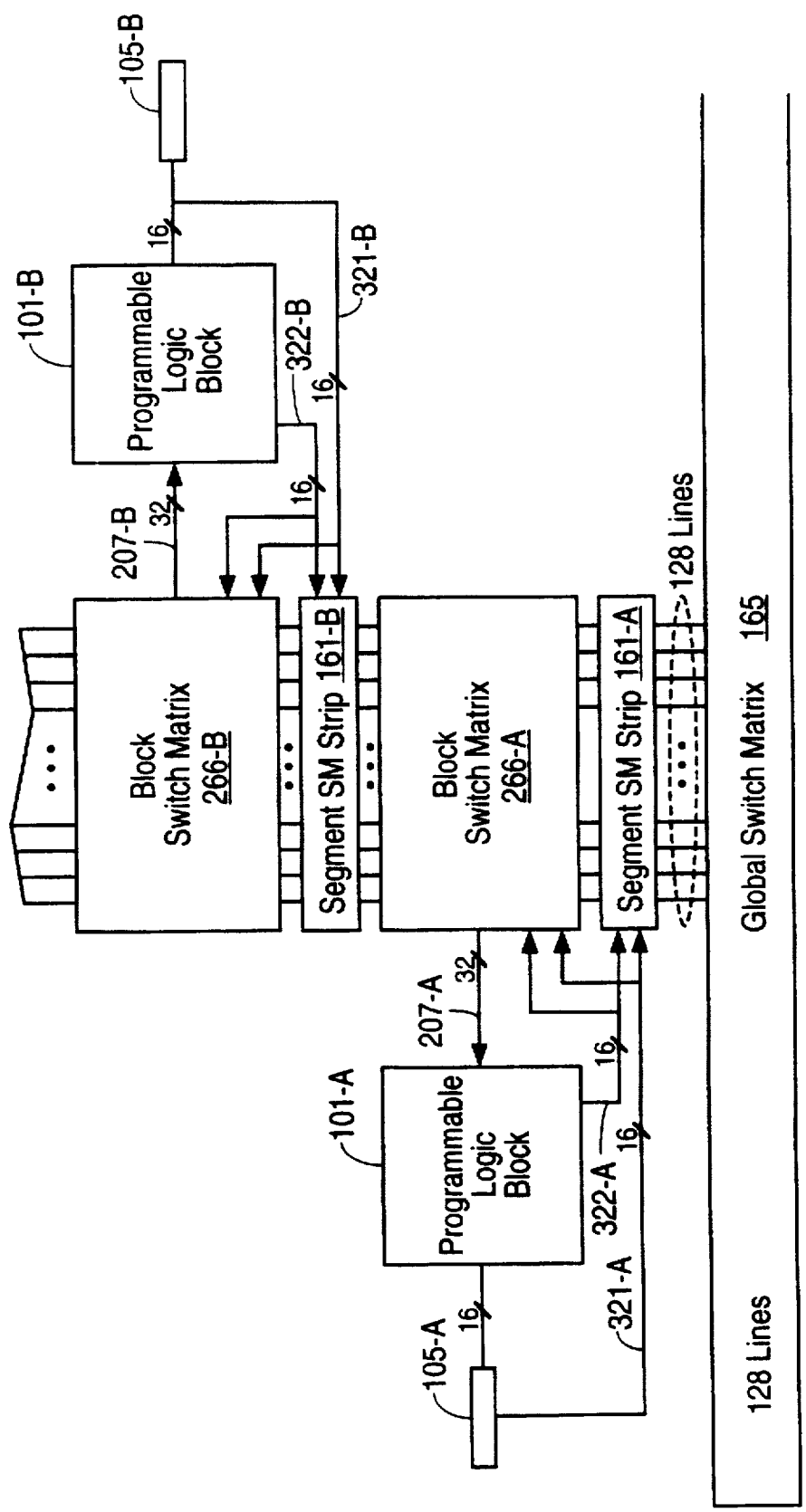

In this embodiment, global switch matrix 165 receives 128 input signals from each segment switch matrix in CPLD 100A. In FIG. 3, the input signals from global switch matrix 165 to segment switch matrix 161 and the input signals from segment switch matrix 161 to global switch matrix 165 are shown as separate sets of lines. However, in another embodiment, a single set of bi-directional signal lines interconnect global switch matrix 165 and segment switch matrix 161 as illustrated in FIGS. 4A and 4B.

Programmable logic block 101-A includes a programmable logic array 310, a programmable optimized-distribution logic allocator 315, and a plurality of programmable logic macrocells 320 that includes macrocells BC0 to BC15, and a macrocell mode control generator circuit 325. I/O cells 330 include a plurality of I/O cells IOC0 to IOC15 and I/O pins 105-A include I/O pins 105-A0 to 105-A15.

In one embodiment, programmable logic array 310 is a programmable-AND fixed-OR logic array(AND/OR array), i.e, a PAL structure. While PAL structure 310 is described herein in terms of an AND/OR array, the AND/OR array is implemented in one embodiment as NOR/NOR logic with NAND/NAND arrays that are functionally equivalent to the AND/OR arrays described herein. Accordingly, the use of AND/OR array logic is illustrative only and is not intended to limit the scope of the invention.

Programmable logic block input lines 207-A from block switch matrix 266-A provide the input signals to a programmable-AND array in PAL structure 310. In one embodiment, each input signal and its complement are provided to the programmable-AND array so that the programmable-AND array has sixty-four input lines. The programmable-AND array in PAL structure 310 has a total of sixty-four logic product terms and a plurality of control product terms 311. In this embodiment, the plurality of control product terms 311 includes twelve product terms. Ten of the control product terms are provided to macrocell mode control generator circuit 325 and two of the control product terms are provided to each of I/O cells 330. However, generally, the number of control product terms is dependent upon the specific configuration of logic macrocells 320, and I/O cells 330.

Each cluster of four product terms drives one OR gate in the fixed-OR gate array of PAL structure 310. In one embodiment, three of the four product terms are fixedly connected to the OR gate and one of the product terms is programmably connectable to and disconnectable from the OR gate. In another embodiment, all of the four product terms are fixedly connected to the OR gate. The sum-of-product terms from an OR gate drives one input line in sixteen input lines 312 of programmable optimized-distribution logic allocator 315.

Programmable optimized-distribution logic allocator 315 is programmable so that sums of product terms from PAL structure 310 are distributed to logic macrocells BC0 to BC15 as required by the user of the CPLD of this invention. As explained more completely below, programmable optimized-distribution logic allocator 315 includes a multiplicity of router elements, that are represented by the horizontal lines within logic allocator 315, where each router element steers a sum of a selected number of sum-of-product terms from PAL structure 310, i.e, a selected number of logic product-term clusters, to a programmably selected logic macrocell. Further, the router elements are configured to optimize the logic efficiency.

Specifically, as described more completely below, programmable optimized-distribution logic allocator 315 provides to each logic macrocell BCi, programmable access to a minimum of twenty product terms without any additional product terms and with only a depth of four product terms per cluster. In addition, selected macrocells and I/O pins have programmable access to a greater logic depth so that logic functions requiring up to thirty-two product terms, i.e., one-half the total number of product terms available for logic, can be implemented in a single pass through CPLD 100A.

Programmable optimized-distribution logic allocator 315 uses a fixed amount of resources, i.e. sixty-four logic product terms, more effectively than the logic allocator described in copending and commonly assigned U.S. patent application Ser. No. 07/924,685, entitled "Architecture Of A Multiple Array High Density Programmable Logic Device With A Plurality Of Programmable Switch Matrices", of Om P. Agrawal et al., filed on Aug. 3, 1992, and issued as U.S. Pat. No. 5,457,409 on Oct. 10, 1995, (the Agrawal patent) which is incorporated herein by reference in its entirety. The logic allocator in the Agrawal patent would require 95 product terms (5 PT/cluster*16 clusters+15 PTs) to achieve the same result. Further, since each I/O pin in CPLD 100A has programmable access to at least twenty product terms, the output switch matrix in the Agrawal patent is no longer required to accommodate changes in logic design and maintain a given pin-out.

According to the principles of this invention, the feedback signal from each logic macrocell and each I/O pin has programmable access to the same uniform number of product terms, i.e., twenty product terms. In the PLD with both a logic allocator and output switch matrix, the feedback signals from I/O pins could be manipulated to provide twenty product terms from a particular I/O pin, but the manipulation resulted in other I/O pins having access to less than twenty product terms. Further, while the product-term distribution at the I/O pins could be varied from I/O pin to I/O pin by the output switch matrix, the feedback product-term distribution from the logic macrocells was fixed. In addition, the output switch matrix introduced another time delay and so reduced the speed of the PLD. As explained more completely below, programmable optimized-distribution logic allocator 315 eliminates all of these potential problems, while providing a greater logic depth than was previously possible for a fixed number of product terms.

Programmable optimized-distribution logic allocator 315 of this invention has less silicon associated with the logic allocator than the silicon in the prior art PLD associated with the fifteen additional product terms, the logic allocator, and the output switch matrix and so facilitates greater functionality in high-density CPLDs. In addition, the speed has been enhanced by elimination of the time delay associated with the output switch matrix.

Hence, unlike the prior art PLDs that required a logic allocator and an output switch matrix to create a symmetric appearance at the I/O pins, programmable optimized-distribution logic allocator 315 provides programmable access to a uniform, symmetric distribution of twenty product terms to each of the I/O pins without an output switch matrix. Further, the feedback signals from the macrocells on lines 322 are uniform and symmetric for the twenty product terms.

The uniform and variable logic product-term cluster distribution of programmable optimized-distribution logic allocator 315 with twenty product terms provides several major benefits. First, the need for "wrap-around" at the boundaries of the programmable logic array for better product-term allocation has been obviated. Second, the need for an output switch matrix between the logic macrocells and the I/O cells also has been obviated. Third, for certain logic macrocells up to thirty-two product terms are available without feedback, i.e., the greater logic depth is available in a single pass through the CPLD. Programmable optimized-distribution logic allocator 315 achieves the flexibility of optimal routability of logic product-term clusters to I/O pins which allows retaining a prior pin-out while changing a logic design. In addition, the twenty logic product terms can be routed to a particular logic macrocell without any additional speed penalty. This number of product terms is typically sufficient to allow complete shuffling of the logic mapped on to the CPLD with the ability to retain prior pin-outs and removes any dependencies of product-term clusters between adjacent macrocells.

The number of product term clusters per router element may be selected in numerous ways. In this embodiment, the selected number of product terms per cluster is preferably three or four and there is one router element in programmable optimized-distribution logic allocator 315 for each logic macrocell BC0 to BC15. However, no router element is permanently connected to a product term cluster. Programmable optimized-distribution logic allocator 315 programmably couples and decouples PAL structure 310 from logic macrocells BC0 to BC15.

In one embodiment, the maximum number of product terms available to a logic macrocell and consequently an I/O pin from the router element ranges from twenty to one-half of the total number of product terms dedicated to logic in programmable logic block 101-A for a plurality of the I/O pins and macrocells. The total number of product terms available to each logic macrocell in the programmable logic block and consequently, each I/O pin, is symmetric and variable.

As explained more completely below, each logic macrocell BCi, where i ranges from 0 to 15, in macrocells 320 receives a plurality of radical block clock signals from macrocell mode control generator circuit 325. Herein, the signals are referred to as radical block clock signals because the signals can include conventional clock signals as well as signals that configure a macrocell for a particular virtual mode of operation as a particular type of storage element. In addition to the ten control product terms, macrocell mode control generator circuit 325 also receives four signals from four dedicated global clock pins CLKPIN. In this embodiment, the signals from the plurality of dedicated global clock pins CLKPIN are provided to the macrocell mode control generator in each programmable logic block of CPLD 100A directly, and also routed through a segment switch matrix 165 for use as logic input signals. In this embodiment, each segment switch matrix may receive any signal on one of the global clock pins. Thus, the signals on dedicated global clock pins CLKPIN can be used either as direct input signal pins to segment switch matrices, or as global dedicated clock pins. Note that if there are more than four segments, some segment switch matrices have no clock input.

Macrocell mode control generator circuit 325 includes a plurality of architectural cells that are used to configure macrocell mode control generator circuit 325 to provide a plurality of radical block clock signals to each programmable logic macrocell BCi in programmable logic block 101-A. The plurality of radical block clock signals can include synchronous clock signals, asynchronous clock signals, and asynchronous preset and reset signals. In addition, macrocell mode control generator circuit 325 can be programmed to provide a dual-edge-sensitive clock that clocks on both rising and falling edges. Thus, a macrocell can be clocked at twice the frequency of the external clock signal. Finally, the plurality of radical block clock signals also can include two clock signals that are exactly 180° out of phase with each other, and mixed clock signals, as described above.

In this embodiment, each programmable logic macrocell BCi includes a programmable multiplexer that receives the plurality of radical block clock signals from macrocell mode control generator circuit 325 and a configurable storage element. Herein, the configurable storage element can be configured to provide a combinatorial output signal. As explained more completely below, an input terminal of the configurable storage element is coupled to an output line from logic allocator 315 and a configuration input/clock terminal of the configurable storage element is connected to the output line from the programmable multiplexer. The particular radical block clock signal passed through the programmable multiplexer determines the characteristics of the configurable storage element. The configurable storage element can be configured at least as any one of D-type flip-flop, a T-type register, a latch, and a combinatorial output signal. Thus, the signals generated by programmable macrocell mode control generator circuit 325 are used to customize each logic macrocell BCi in programmable logic block 101-A.

While the functionally of the programmable macrocell of this invention is similar to that in prior art CPLDs, the implementation of the functionality using only a programmable multiplexer and a three terminal configurable storage element is fundamentally different from prior art macrocells. In the prior art CPLDs, the registers and latches in the macrocell were thought of as storage elements with each storage element having a clock terminal, an asynchronous preset terminal, an asynchronous reset terminal, and possibly an enable terminal in addition to the input and output terminals. Typically, the signals used to drive the clock terminal, the asynchronous preset terminal, and the asynchronous reset terminal were either implemented using macrocell specific resources, e.g., a product-term from the cluster associated with the macrocell, or resources common to the programmable logic block containing the macrocell.

According to the principles of this invention, the preset, reset, and clock signals for a register or a latch are not independent from the partitioning process for a programmable logic block. The preset, reset and clock signals are combined into a radical block clock expression that is implemented by programming macrocell mode control generator circuit 325. This radical block clock synthesis is a dynamic part of the partitioning process and includes feasibility of implementation of each logical radical block clock and the simultaneous logical-to-physical mapping of all radical block clock signals for a programmable logic block so as to support all registers and latches in the programmable logic block that receive a radical block clock signal as determined by partitioning or pre-assignment. Further, the preset and reset signals also influence the synthesis process for the primary equation. As shown below, the complement of the reset signal is logically ANDed with primary equation elements, and the true state of the reset signal is logically ORed with the clock signal. Also, the true state of the preset signal is logically ORed with the primary equation elements and the clock signal. In effect, the implementation of the preset and reset signals modify the product-term considerations of the synthesis objective for the primary equation.

In this embodiment, an output line Ai from logic macrocell BCi drives a feedback line to hierarchical switch matrix 160, and an input line to an I/O cell. In another embodiment, the programmable logic macrocells are divided into output logic macrocells and buried logic macrocells. The output logic macrocells function as just described. The buried logic macrocells only provide feedback signals to hierarchical switch matrix 160. In yet another embodiment, some programmable logic blocks in the CPLD contain all buried logic macrocells, e.g., these programmable logic blocks are not tied to any I/O pins and others have all output logic macrocells. This gives similar functionality to a CPLD with programmable logic blocks where some of the macrocells are buried macrocells and others are output macrocells and at the same time alleviates routing problems to I/O pins associated with programmable logic blocks that are not on the periphery of the CPLD.

Each I/O cell IOCi, where I/O cell IOCi is any one of I/O cells IOC0 to IOC15, selectively connects and disconnects logic macrocell BCi output signal to I/O pin 105-Ai. In this embodiment, each I/O cell IOCi can be configured -o connect logic macrocell BCi output signal to I/O pin 105-Ai, to tri-state I/O pin 105-Ai or to control the signal supplied to I/O pin 105-Ai with one of the two product terms that are common to all the I/O cells in programmable logic block 101-A.

Hierarchical Switch Matrix

In this embodiment segment switch matrix 161 is programmably configured to select 128 signals to drive the 128 input lines to each block switch matrix from a total of the 256 signals on the input lines to segment switch matrix 161. Thus, segment switch matrix 161 receives a maximum of 128 intra-segment signals plus another 128 signals from the global switch matrix 165, and provides 128 input signals to each block switch matrix in a segment. Herein, the particular number of signals and lines in a switch matrix are illustrative only and are not intended to limit the invention to the particular numbers given.

Segment switch matrix 161 could be implemented using programmable multiplexers. Conceptually, each segment switch matrix output line could be connected to one of a 4:1 or 6:1 or 8:1 programmable multiplexer to provide 2 ways, 3 ways or 4 ways of signal routability, respectively. However, as indicated above, segment switch matrix 161 is preferably implemented using a plurality of programmable demultiplexers.

As previously indicated, for programmable logic block 101-A with sixteen macrocell feedback lines 322-A and sixteen I/O pin feedback lines 323-A, each strip 161-A to 161-D of segment switch matrix 161 has a total of thirty-two input lines that carry feedback signals from the associated local block for a total of 128 lines. In general, each strip has one input line for each macrocell feedback line and each I/O pin feedback line of the programmable logic block associated with the strip, i.e. one line for each local feedback signal. Each strip is designed to be completely independent of the other strips in a segment switch matrix.

Each feedback line to the strip is connected to the input terminal of a programmable demultiplexer. Each output terminal of the programmable demultiplexer is connected to a different line in a segment switch matrix bus. The number of demultiplexer output terminals connected to lines in the segment switch matrix bus determines the number of paths through the segment switch matrix for each input signal.

However, each strip needs to accommodate the situation in which a local feedback signal is not connected to the segment switch matrix bus and the signal from the global switch matrix is passed through the segment switch matrix to a programmable logic block. Here, local is used to distinguish feedback signal generated within the segment from signals provided to the segment through global switch matrix 165. Consequently, two signal paths through segment switch matrix 161 for each local feedback signal plus the option of no connection requires a 1:3 programmable demultiplexer. In this case, the programmable demultiplexer has two states. In the first state, the programmable demultiplexer programmably connects the input terminal to one output terminal and disconnects the input terminal from all other output terminals. In the second state, the programmable demultiplexer disconnects the input terminal from all the demultiplexers output terminals connected to the segment switch matrix bus. Similarly, three-way signal routability plus the option of no connect requires a 1:4 programmable demultiplexer. In this embodiment, to provide three way routability for each signal and a no connection option, segment switch matrix 161 utilizes 1:4 programmable demultiplexers, one for each input line from a macrocell or an I/O pin.

The use of demultiplexers makes the independent strip architecture of segment switch matrix 161 possible. This strip architecture is significant because, as explained above, the various strips are independent. Thus, the strip architecture is easily scalable and can easily accommodate changes in the number of feedback lines as well as changes in the number of programmable logic blocks per segment.

As explained above in this embodiment, segment switch matrix 161 drives 128 input lines to each block switch matrix, which in FIG. 3 are lines 209-A to block switch matrix 266-A. Block switch matrix 266-A also has 2*p local feedback input lines that include sixteen feedback lines 322 from the macrocells in programmable logic block 101-A, and sixteen feedback lines 321 that carry signals on I/O pins 105-A. In another embodiment, the number of I/O pin feedback lines can be different from the number of macrocell feedback lines.

Thus, in this embodiment, the output signals from block switch matrix 266-A can be programmably selected from: (i) direct feedback signals from programmable logic block 101-A; (ii) direct feedback signals from I/O pins 105-A; and (iii) signals from segment switch matrix 161. Block switch matrix 266-A drives the selected output signals on the thirty-two input lines 207-A to programmable logic block 101-A. The particular number of input lines to a programmable logic block is a function of the number of macrocells in the block. For example, preferably there are at least two input lines for each logic macrocell.

In this embodiment, block switch matrix 266-A is a multiplexer based structure. In each CPLD, the multiplexer size is appropriately selected for a given number of programmable logic block input lines 207-A to provide a predetermined routability. The appropriate multiplexer size for block switch matrix 266-A is given by:

Mux size=Integer{((Total no. of input signals to block switch matrix)×(Number of signal paths through block switch matrix))/(No. of block switch matrix output lines)} where Integer takes the integer value of the expression. One multiplexer is used for each output line of block switch matrix 266-A.

Thus, for block switch matrix 266-A and a 32V16-like programmable logic block 101-A, the total number of input signal lines to block switch matrix 266-A is 160 lines (128 lines 207-A from segment switch matrix 161 and thirty-two local block feedback lines 322 and 321). If a minimum of two ways of routability, i.e., two signal paths through block switch matrix 266-A is desired for each input signal, and block switch matrix has thirty-two output lines 207-A, the block switch matrix multiplexer size is:

160*2/32=10:1

Note that this is just an example. Other multiplexer sizes can easily be accommodated for a particular routability. A larger programmable multiplexer size results in increased routability, and a smaller programmable multiplexer size results in decreased routability.

In the above embodiment with a 10:1 programmable multiplexer, each of the signals from segment switch matrix 161 and each of the direct local feedback signals on lines 321 and 322 has two signal paths through block switch matrix 266-A. However, in another embodiment, each input signal to block switch matrix 266-A does not have the same number of paths through block switch matrix 266-A. The use of a smaller multiplexer and a different number of signal paths for different signals provides a means to optimize the die area used by block switch matrix 266-A.

Specifically, in one embodiment, a plurality of 8:1 programmable multiplexers are used with the thirty-two output lines so that there are a total of 256 signal paths. Each of the block feedback signals on lines 322 and 321 are provided to an input terminal of a different programmable multiplexer so that each of these signals has a single path through the block switch matrix. Since thirty-two of a possible 256 paths through the block switch matrix are for local feedback signals, 224 paths are available for the 128 input signals from segment switch matrix 161 on lines 209-A. Thus, these signals can have one, two or more paths through block switch matrix 266-A. The use of programmable 8:1 multiplexers requires less silicon than the 10:1 multiplexers in the previous embodiment.

The output signals from block switch matrix 266-A can be programmably selected from: (i) direct feedback signals from programmable logic block 101-A; (ii) direct feedback signals from I/O pins 105-A; and (iii) signals from segment switch matrix 161.

Global switch matrix 165 receives a plurality of signals from each segment switch matrix in the CPLD. Global switch matrix 165 is implemented as a bus that is programmably connected to and disconnected from each of the segment switch matrices through a programmable demultiplexer.

In this embodiment, global switch matrix 165 is a 128-line bus and a plurality of programmable demultiplexers. The 128-line bus is connected to segment switch matrix 161 by a first programmable demultiplexer; to segment switch matrix 162 by a second programmable demultiplexer; to segment switch matrix 163 by a third programmable demultiplexer; and to segment switch matrix 164 by a fourth programmable demultiplexer.

For example, to achieve two-way routability plus the option of no connect capability in global switch matrix 165, each line in the 128-line bus is an input line to a 1:3 programmable demultiplexer where two output terminals of the programmable demultiplexer are connected to two lines in the 128-line bus of the segment switch matrix and the third output terminal has no connection. To achieve three-way routability plus no connect, the 128-lines in the global switch matrix 165 matrix are connected via 1:4 demultiplexers to the 128 line bus in the segment switch matrix. In another embodiment, a line in the segment switch matrix bus drives the input terminal of a demultiplexer in global switch matrix 165 and the output terminals are each connected to one line in the bus of global switch matrix 165.

FIG. 4A is another representation of hierarchical switch matrix 160, as presented in FIGS. 1 to 3. In FIG. 4A, the input cells are taken as a straight pass through and so are not shown. The programmable connections in the various demultiplexers and multiplexers of hierarchical switch matrix 160 are implemented using pass transistors. The 128 input lines to each block switch matrix are driven by segment switch matrix bus 401 in segment switch matrix 161. The 128-lines in segment switch matrix bus 401 are connected and disconnected through demultiplexers 402 to the 128-line global switch matrix bus 405. Similarly, local feedback lines from I/O pins and macrocells drive input lines of multiplexers in the block switch matrix and input lines of demultiplexers in the segment switch matrix strip. The output lines of the demultiplexers in the segment switch matrix strip are connected to selected lines in segment switch matrix bus 401. The lines of segment switch matrix bus 401 for each strip are selected so as to optimize signal routability. However, the particular selection for a given strip is not an important aspect of this invention.

FIG. 4A illustrates the various hierarchical levels in CPLD 100A. Signal paths 420-A and 420-B through a block switch matrix and a programmable logic block define a first hierarchical level. Signal path 430 through segment switch matrix 161, block switch matrix 266-B and programmable logic block 101-B defines a second hierarchical level. Signal path 440 from a segment switch matrix to global switch matrix 165 through segment switch matrix 161 to block switch matrix 266-A and in turn to programmable logic block 101-A defines a third hierarchical level.

Notice that a signal on the first hierarchical level does not require any resources of the second and third hierarchical levels. Similarly, signals that utilize the second hierarchical level do not require any resources of the third hierarchical level. Thus, for a given hierarchical level, resources for any higher hierarchical levels are not required.

FIG. 4B is the same as FIG. 4A, except FIG. 4B illustrates the layout of the various parts in a more compact representation. In one embodiment, the CPLDs of this invention are implemented using a 0.5 micron, three-metal layer electrically erasable CMOS technology. In another embodiment, the CPLDs of this invention are implemented using a 0.65 micron, two-metal layer electrically erasable CMOS technology.

The modular structure illustrated in FIG. 4A, combined with the fixed number of lines in each segment switch matrix and in each global switch matrix results in significantly easier scalability to higher density compared with the prior art interconnect methods. Further, the number of lines in the various switch matrices of hierarchical switch matrix 160 are only illustrative of the principles of this invention are not intended to limit the invention to the particular number of lines recited. In view of this disclosure those skilled in the art can implement hierarchical switch matrix 160 with various numbers of lines and various sizes of multiplexers or demultiplexers.

Global switch matrix 165 can be easily extended to support a number of segments with no change to the basic architecture of a bus and programmable demultiplexers for each segment switch matrix. Each new segment is treated as completely independent and has its own interconnection pattern, i.e., programmable demultiplexer, with the global switch matrix 165.

The combination of a three-level programmable switch matrix with two of the levels implemented as programmable demultiplexers and the associated simple addition of segments has a significant affect on the speed of an entire family of CPLDs that includes the three-level hierarchical switch matrix of this invention. While a specific embodiment was described above, the timing delays described are generally applicable to a wide number of CPLDs with differing numbers of segments.

A local feedback signal to a programmable logic block through the programmable block switch matrix, i.e., a first level hierarchical signal, has a very fast signal propagation delay. Specifically, there is a one pass transistor delay for all intra-block signals. Similarly, a second level hierarchical signal, i.e., intra-segment signals, experience two pass transistor delays. Thus, all programmable logic blocks within a segment can communicate with each other and the signals experience a maximum of two pass transistor delays.

For a CPLD with only two segments, inter-segment signals, i.e., third level hierarchical signals, experience three-pass transistor delays and for CPLDs with more than two segments, inter-segment signals experience at least four-pass transistor delays. Thus, in a CPLD with 256 macrocells and maximum of 256 I/O pins, i.e., four segments, signals within one segment can communicate with any other segment with a worst case delay of four pass transistor delays. Herein, the time delays are characterized by the number of pass transistor delays. However, those skilled in the art will understand that the actual delay includes a component associated with the bus in the switch matrix.

As indicated above, the time delays through each level of hierarchical switch matrix 160 are fixed, predictable, and deterministic. In this embodiment, all segments are symmetric and exhibit similar timing characteristics, independent of the CPLD density. Thus, the time delay through a programmable logic block and a programmable block switch matrix is the same for all segments. Similarly, the time delay through a programmable logic block, a programmable block switch matrix, and a segment switch matrix is the same for all segments. The only timing characteristic that changes based on the density of the CPLD is the inter-segment communication speed. Of course, a CPLD could be built using the hierarchical structure of this invention with differing size segments as well as with different programmable logic blocks within a segment. For example, a programmable logic block in a segment could have all of the output lines tied to I/O pins of the CPLD, and another programmable logic block in the segment could only drive feedback lines.

In addition to the uniform speed characteristics associated with the symmetric segments, the symmetric segments and the independence of the segments with respect to the global switch matrix significantly enhance the ability to implement a CPLD of this invention in silicon via a step-and-repeat methodology. The independence of the global switch matrix size from the segment switch matrices allows the size of the global switch matrix to be changed without affecting the segment switch matrices. In the embodiment described above, the global switch matrix has 128 lines. However, the global switch matrix could also be implemented with 160, 192, or 256 lines, for example.

In another embodiment of this invention, each programmable logic block and each plurality of I/O pins for that programmable logic block provide feedback signals not only to the programmable logic block switch matrix, but also to an input switch matrix bank of an input switch matrix that in turn programmably connects and disconnects the feedback signals to a segment switch matrix.

Optimized-distribution Logic Allocator 315

Figure 5:
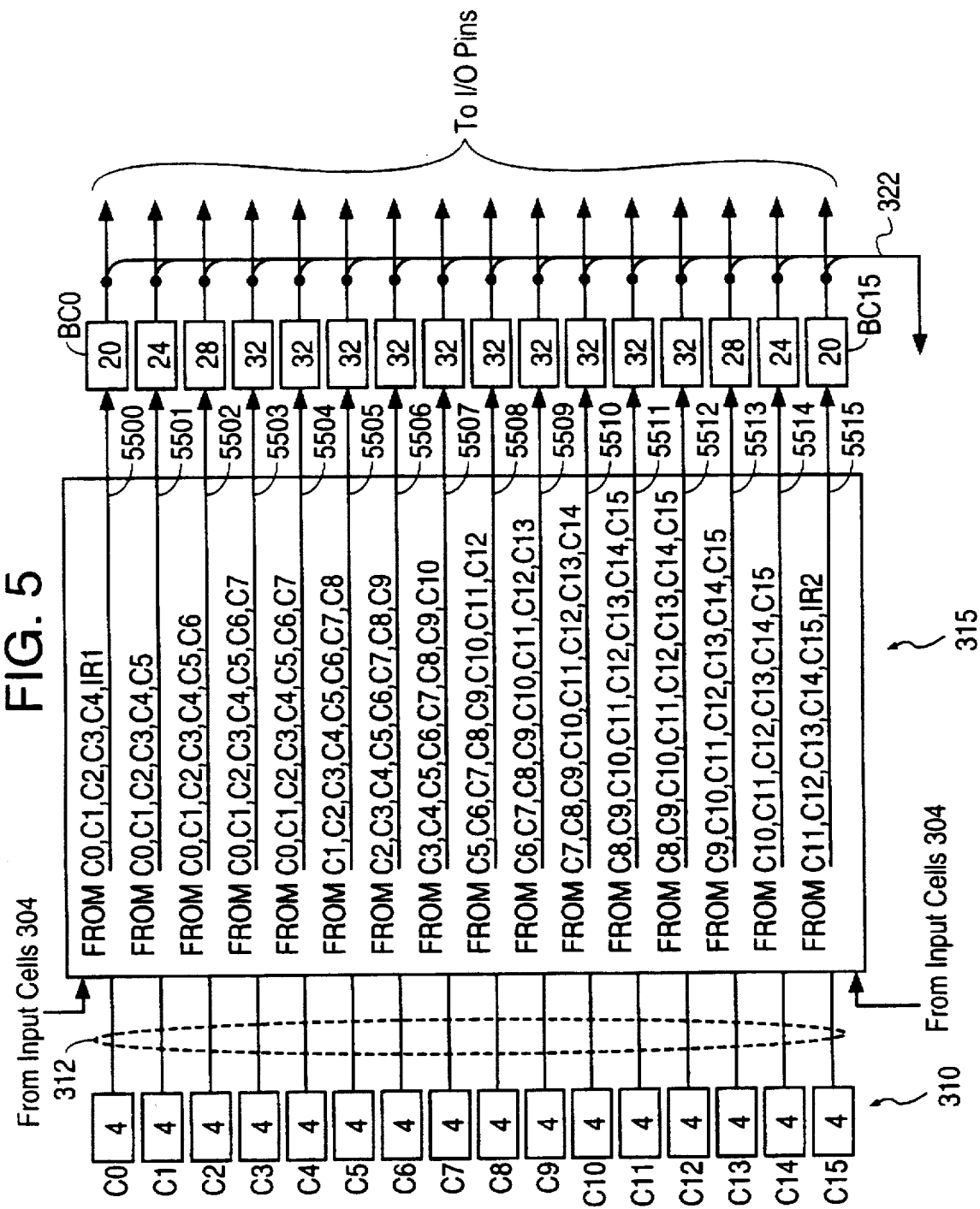
FIG. 5 is a block diagram that illustrates the interconnections between router elements and the steering of product-term clusters by the logic allocator of this invention.

One embodiment of programmable optimized-distribution logic allocator 315 is illustrated in FIG. 5. Other embodiments of the programmable optimized logic allocator 315 of this invention are described in copending, commonly filed, and commonly assigned U.S. patent application Ser. No. 08/459,570, entitled "A PROGRAMMABLE OPTIMIZED-DISTRIBUTION LOGIC ALLOCATOR FOR A HIGH-DENSITY COMPLEX PLD" of Om P. Agrawal et al. filed on Jun. 2, 1995, which is incorporated herein by reference in its entirety.

In FIG. 5, boxes C0 through C15 on the left-hand side of the figure, each of which contains the numeral "4", represent the product-term clusters in product-term array 310. On the right-hand side of FIG. 5 are 16 boxes BC0 through BC15 which represent logic, e.g., logic macrocells, that couples the output signals of logic allocator 315 to the I/O pins. The number within boxes BC0 to BC15 is the maximum number of product terms that logic allocator 315 can route to a particular macrocell and consequently to a particular I/O pin.

Each horizontal line 5500 to 5515 within logic allocator 315 represents a programmable router element, sometimes called a router element. In this embodiment, each router element has an output line connected to a logic macrocell and the associated I/O pin. The numbers on a horizontal line within logic allocator 315 represent the product-term clusters, as numbered on the left-hand side of the figure, that can be connected to the output line of the programmable router element. Anywhere from none to all of the product-term clusters shown on a line can be connected to the output line of the programmable router element. Further, based on the granularity of the product-term clusters, i.e, the ability to configure the number of product terms in a cluster, the logic allocator of this invention provides the capability to vary the number of product terms steered to an output line of the logic allocator over a wider range than prior art logic allocators.

A programmable router element within logic allocator 315 is programmably coupled and decoupled to a maximum of eight logic allocator input lines. Specifically, each output line of router elements 5503 to 5512 is programmably couplable to eight logic allocator input lines. When a logic allocator input line is coupled to a particular router element output terminal, that input line is not available to any other router element. Thus, ten router elements can programmably steer any combination of up to eight logic allocator input signals to an I/O pin or other logic in the CPLD. Thus, when a product-term cluster has a maximum of four product terms, ten of the I/O pins can programmably receive up to thirty-two product terms.

Each output line of router elements 5502 and 5513 is programmably couplable to seven logic allocator input lines. Again, when a logic allocator input line is coupled to one of these router elements, that input line is not available to any other router element. Thus, two router elements can programmably steer any combination of up to seven logic allocator input signals to an I/O pin or other logic in the CPLD. Thus, when a product-term cluster has a maximum of four product terms, two of the I/O pins can programmably receive up to twenty-eight product terms.

Each output line of router elements 5501 and 5514 is programmably couplable to six logic allocator input lines. Again, when a logic allocator input line is coupled to one of these router elements, that input line is not available to any other router element. Thus, two router elements can programmably steer any combination of up to six logic allocator input signals to an I/O pin or other logic in the CPLD. Thus, when a product-term cluster has a maximum of four product terms, two of the I/O pins can programmably receive up to twenty-four product terms.

Each output line of router elements 5500 and 5515 is programmably couplable to five logic allocator input lines. Again, when a logic allocator input line is coupled to one of these router elements, that input line is not available to any other router element. Thus, two router elements can programmably steer any combination of up to five logic allocator input signals to an I/O pin or other logic in the CPLD. Thus, when a product-term cluster has a maximum of four product terms, two of the I/O pins can programmably receive up to twenty product terms.

In addition, in this embodiment, router elements 5500 and 5515 are coupled to input cells 304. Specifically, router element 5500 receives output signal IR1 from the first input cell that in turn is driven by the signal on the I/O pin associated with macrocell BC2. Router element 5515 receives output signal IR2 from the other input cell that in turn is driven by the signal on the I/O pin associated with macrocell BC13. The routing of two I/O pin signals through logic allocator 315 permits direct routing of the two I/O pin signals to two logic macrocells. Thus, the two I/O pin signals can function as registered input signals for the purpose of synchronizing asynchronous signals and providing fast set up times. Considering the application of the two I/O pin signals directly through logic allocator 315, the relationship between the setup and hold times is not critical, because by definition, the arrival of the signals can not be predicted. Nevertheless, the sum of the setup and hold times is preferably as small as possible.

Programmable optimized-distribution logic allocator 315 utilizes the fixed product-term resources more efficiently than the prior art logic allocators, and supports logic design changes while maintaining a given pin-out without requiring an output switch matrix.

Figure 6A:
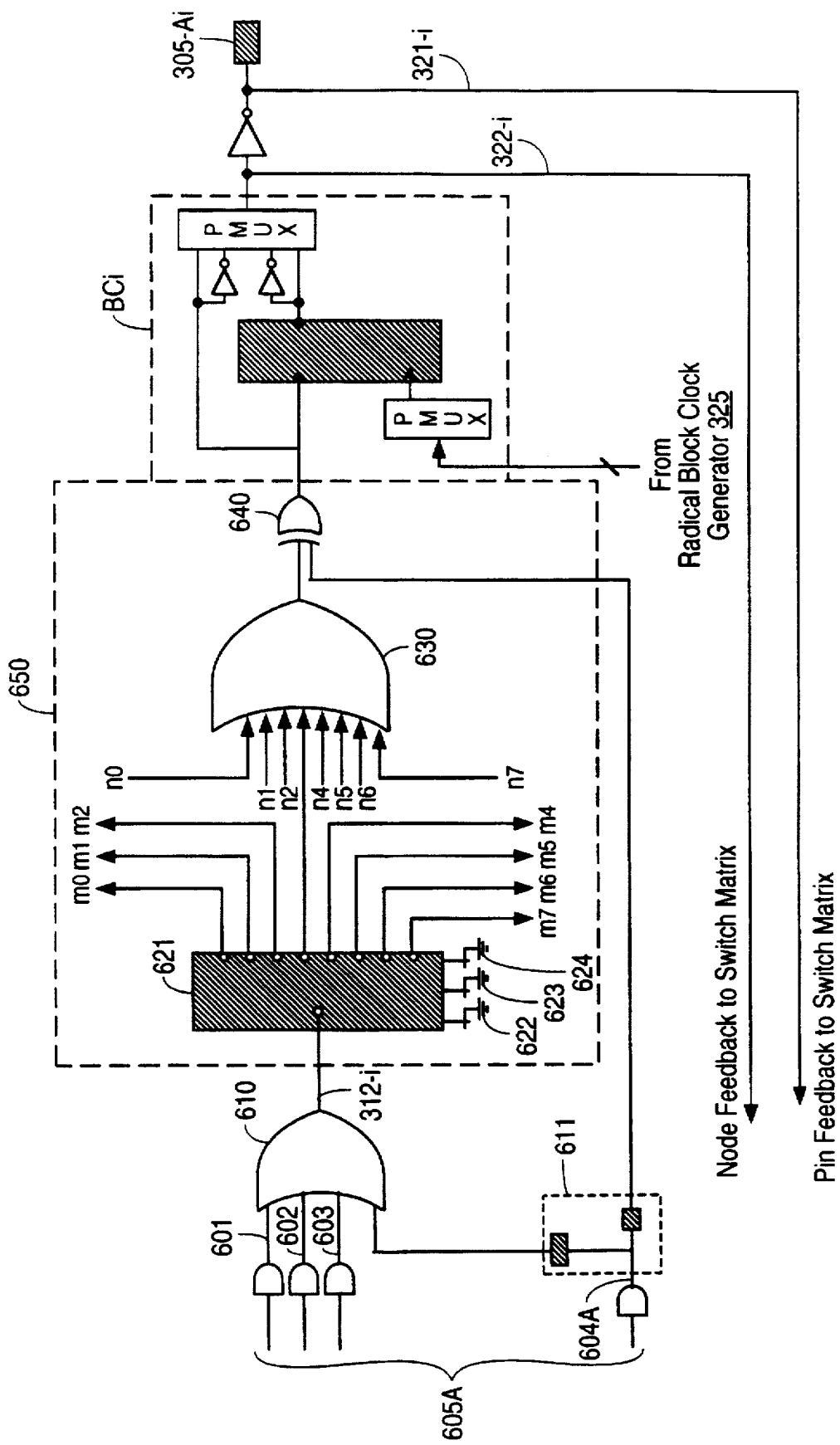
FIG. 6A is one embodiment of a product-term cluster, and a router element in the logic allocator of this invention.

FIG. 6A is a schematic of a typical router element 650 in a first embodiment of programmable optimized-distribution logic allocator 315 for router elements 5503 to 5512. In FIGS. 6A and 6C, programmable logic macrocell BCi is only representative of the functionality of the macrocell of this invention and is not intended to necessarily illustrate a specific implementation of the macrocell.

A product-term cluster 605A includes four product terms 601 to 604A. Three product terms 601 to 603 are each fixedly connected to a different input terminal of OR gate 610 and a fourth product-term 604A is programmably connectable to and disconnectable from OR gate 610 by a programmable connecter 611. Product-term cluster 605A and OR gate 610 are included in programmable logic array 310.

Logic allocator input line 312-i represents one input line in the plurality of input lines 312 of programmable optimized-distribution logic allocator 315. Logic allocator input line 312-i connects an output terminal of OR gate 610, e.g., an output terminal of a logic gate, to an input terminal of a programmable demultiplexer 621, that, in this embodiment, is a 1-to-8 programmable demultiplexer. Thus, product-term cluster 605A is connected to the input terminal of programmable demultiplexer 621.

Each output terminal of programmable demultiplexer 621 is connected to an input terminal of a different OR gate within logic allocator 315 so that programmable demultiplexer 621 has one output terminal connected to one input terminal of eight different OR gates in eight different router elements. Thus, router element 650 is interconnected to seven other router elements by lines m0 to m2 and m4 to m7. For example, the fourth output terminal of programmable demultiplexer 621 is connected to an input terminal of OR gate 630. The other seven output terminals are connected to input terminals of OR gates in the seven other router elements by lines m0 to m2, and m4 to m7 respectively.

A signal on input line 312-i is programmably connected to one of the output terminals of programmable demultiplexer 621 and programmably disconnected from the remainder of the output terminals by the configuration of architectural cells 622 to 624 respectively. Architectural cells 622 to 624 may be fuses, EPROM cells, EEPROM cells, RAM cells, or CMOS antifuse technology. The architectural cells are a means for providing an output terminal select signal to a programmable demultiplexer so that the programmable demultiplexer passes the selected input signal there-through to a specified output terminal.

As described above, OR gate 630 in router element 650 has one input terminal connected to the fourth output terminal of programmable demultiplexer 621. The other seven input lines to OR gate 630 are connected to output terminals of seven programmable demultiplexers by lines n0 to n2 and n4 to n7. In this embodiment, the output terminal of OR gate 630 is connected to a first input terminal of an exclusive-OR gate 640. A second input terminal of exclusive-OR gate 640 is connected to programmable connector 611. An output terminal of exclusive-OR gate drives an input line of a logic macrocell BCi that drives a first feedback line 322-i and is coupled to an I/O pin that drives a second feedback line 321-i. In a first state programmable connector 611 routes product-term 604A to OR gate 610 and in a second state to exclusive-OR gate 640.

Router elements 5500 to 5502 and 5513 to 5515 (FIG. 5) are similar to those in FIG. 6A, except not all of the output terminals of demultiplexer 621 and not all of the input terminals of OR gate 630 are utilized. In particular for logic allocator 315 (FIG. 5), the number of horizontal lines on which a particular product-term cluster appears defines the number of output terminals of demultiplexer 621 that are utilized. For example, product-term cluster C0 appears on five horizontal lines in FIG. 5, and so in router element 5500 only five of the eight output terminals of the programmable demultiplexer are utilized. Similarly, the number of product terms on a horizontal line within logic allocator 315 in FIG. 5 defines the number of input terminals of OR gate 630 in the router element that are used.

Unlike prior art logic allocators that also included a demultiplexer and a logic gate, each programmable router element 650 in programmable optimized-distribution logic allocator 315 is programmable so that product terms clusters are distributed to any one of from five to eight logic macrocells as required by the user of the CPLD of this invention, e.g., to OR gate 630 and consequently to logic macrocell BCi.

In this embodiment, the total number of product terms programmably available to each logic macrocell in the programmable logic block is the same, i.e., the product-term allocation is symmetric, uniform and variable for twenty product terms and symmetric and variable for twenty to thirty-two product terms. However, no product-term clusters are permanently connected to an output line of programmable optimized-distribution logic allocator 315. The need for wrap-around has been eliminated as has the need for an output switch matrix. Further, router element 650 provides greater flexibility than the prior art logic allocator and output switch matrix combination as described above while eliminating the time delay associated with the output switch matrix.

Thus, the major benefits of programmable optimized-distribution logic allocator 315 made up of router elements 650 include: full product-term distribution symmetry for twenty product terms; up to thirty-two logic product terms for selected macrocells BCi; complete shuffling of logic is possible with the ability to retain prior pin-outs; obviation of the need for an output switch matrix; obviation of the need for any product-term wrap-around for up to twenty product terms; and faster speed relative to the combination of the prior art logic allocator and an output switch matrix combination. By allowing up to thirty-two product terms for selected macrocells, logic allocator 315 increases the macrocell feedback to thirty-two product terms. This allows a designer to implement up to thirty-two product terms of logic with a single pass of delay.

In addition, with product-term cluster 605A, which is split into a three product-term cluster and a one product-term cluster, single product-term 604A can be steered to allow up to a four product-term cluster if needed. Hence, product-term cluster 605A is a superset of a product-term cluster where all of the product terms are fixedly attached to the OR gate. Since each product-term cluster 605A includes two separate product-term clusters, logic allocator 315 is not forced to steer the whole four product-term cluster to another macrocell. If a macrocell needs a single product-term, the macrocell can use its single product-term and the other three unused product terms can be steered to adjacent macrocells by logic allocator 315 for better logic utilization.

Further, the three-plus-one product-term steering with built-in XOR gate 640 allows macrocell BCi to emulate T or J-K type flip-flops. Also, XOR gate 640 in logic allocator 315 gives built-in polarity control and allows simpler logic macrocells BCi. In another embodiment, the output terminal of OR gate 630 is connected directly to the logic allocator output line.

Figure 6B:
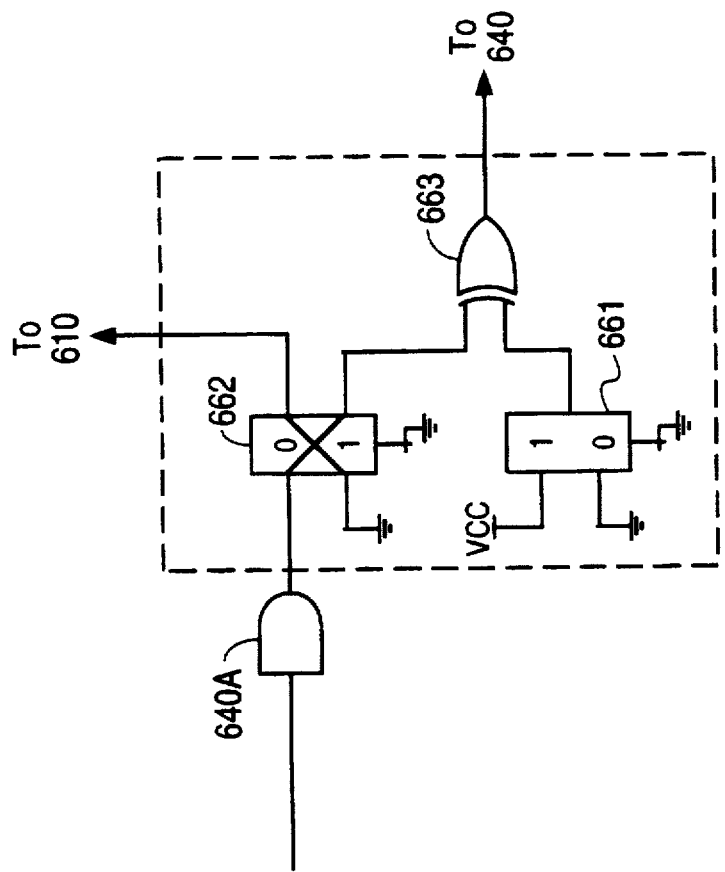
FIG. 6B is a more detailed diagram of the programmable signal connector of FIG. 6A.
Figure 6C:
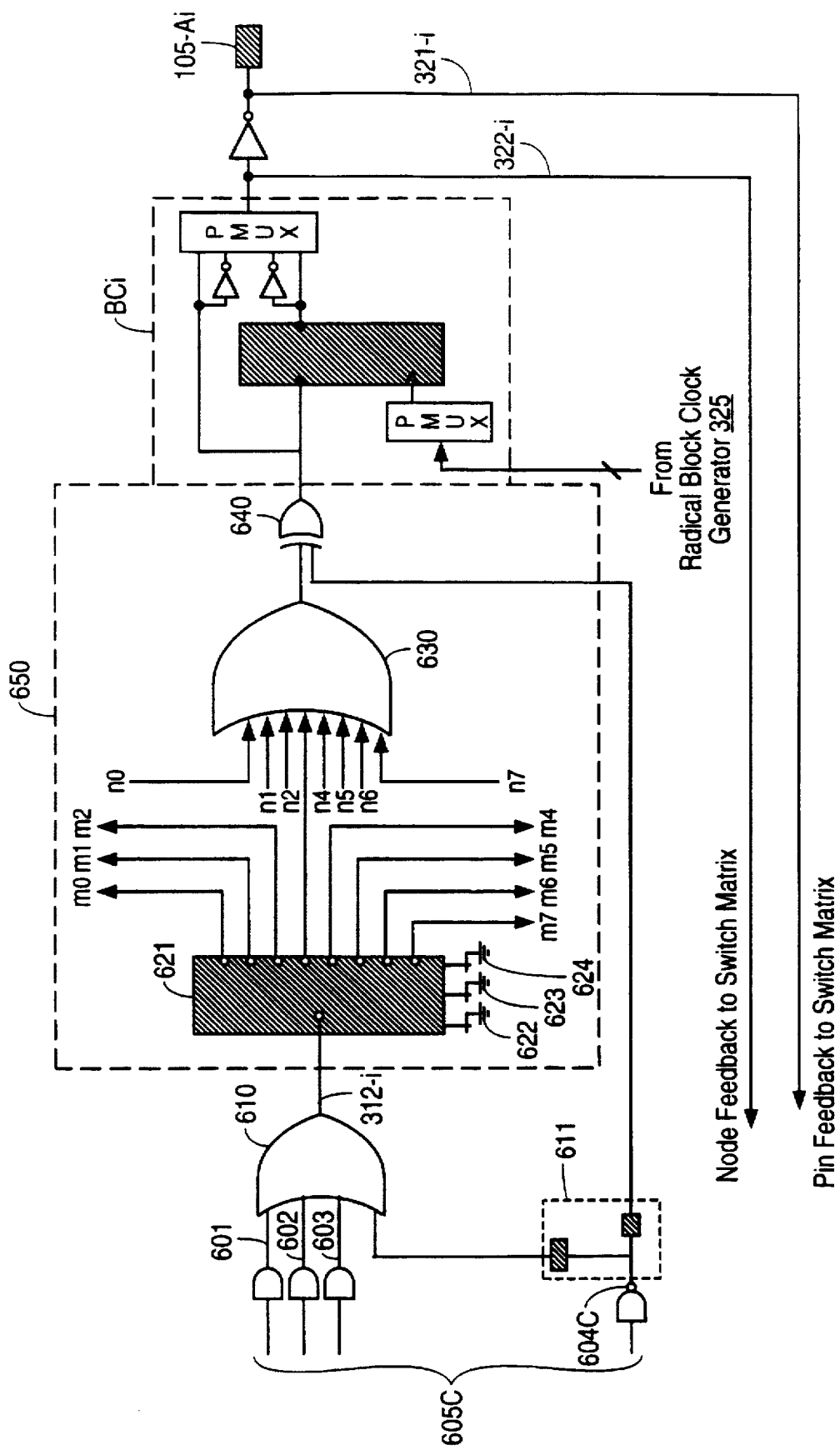
FIG. 6C is another embodiment of a product-term cluster with the router element of the logic allocator of this invention.

FIG. 6B is a more detailed diagram of one embodiment of programmable connecter 611 that includes a programmable two-to-one multiplexer 661, a programmable signal router 662, and an exclusive-OR gate 663.

In yet another embodiment, router element 650 (FIG. 6C) is utilized in programmable optimized-distribution logic allocator 315, but product-term cluster 605C has three AND product terms fixedly connected to OR gate 610 and a NAND product-term programmably connectable to and disconnectable from OR gate 610 and exclusive-OR gate 640.

Figure 7A:
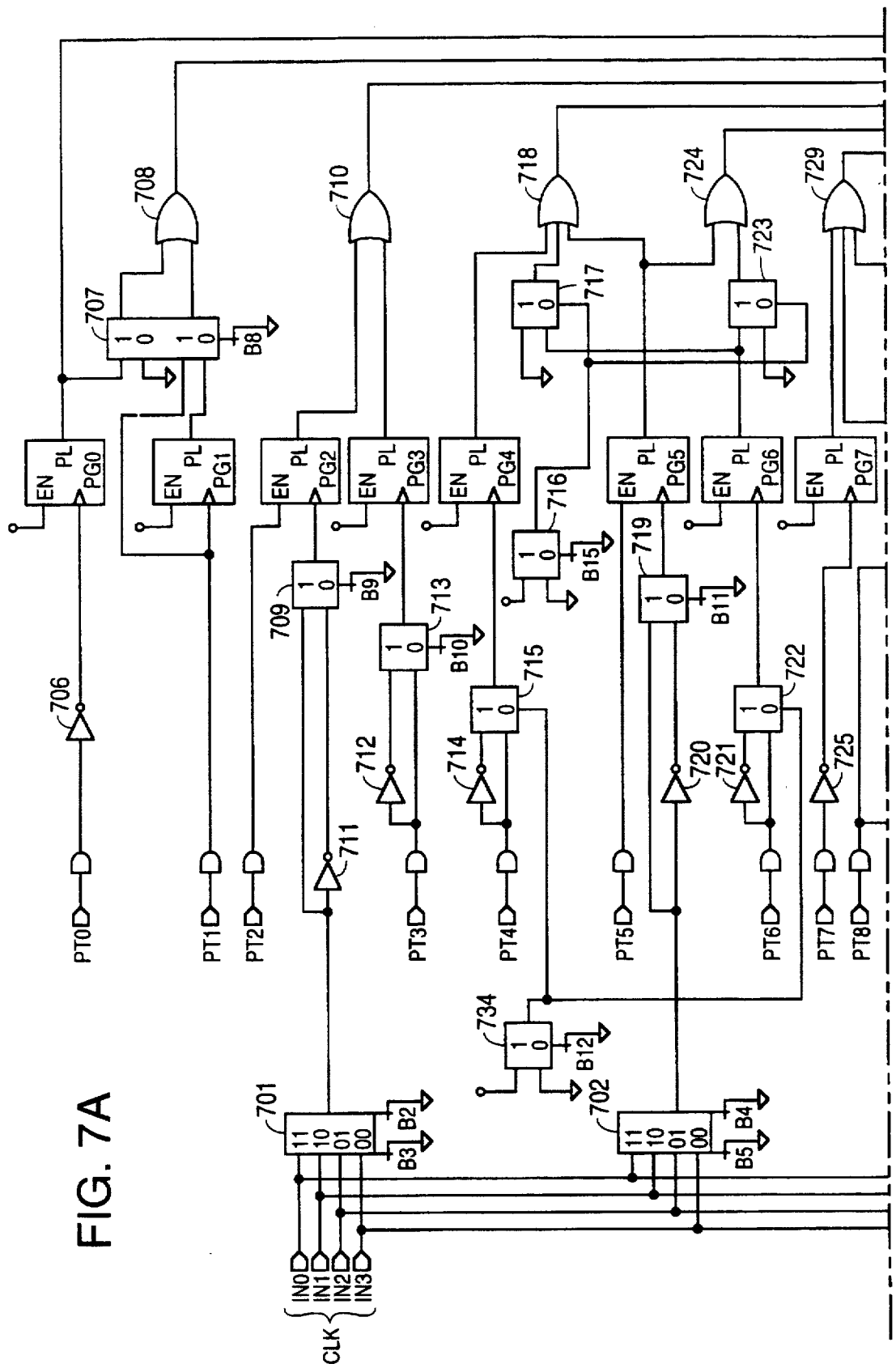
FIG. 7, presented as FIGS. 7A and 7B, is a schematic diagram of one embodiment of the macrocell mode control generator circuit of this invention.

In yet another embodiment of this invention, the programmable optimized-distribution logic allocator could be replaced by a programmable uniform distribution logic allocator that is described in copending, commonly filed, and commonly assigned U.S. patent application Ser. No. 08/459,234, entitled "A PROGRAMMABLE UNIFORM SYMMETRICAL DISTRIBUTION LOGIC ALLOCATOR FOR A HIGH-DENSITY COMPLEX PLD" of Om P. Agrawal et al., filed on Jun. 2, 1995, which is incorporated herein by reference in its entirety. In particular, the embodiments illustrated in FIGS. 7A and 7B of that application can be used directly in place of logic allocator 315.

Macrocell Mode Control Generator

FIG. 7 is a more detailed diagram of one embodiment of macrocell mode control generator circuit 325. The four global clock signals from dedicated clock pins PINCLK are input signals to programmable multiplexers 701 to 703. Each of programmable multiplexers has two architectural cells, i.e. cells B2 and B3 for multiplexer 701, cells B4 and B5 for multiplexer 702, and cells B6 and B7 for multiplexer 703, that are programmed to pass one of the four global clock signals therethrough to the output line of the programmable multiplexer. The connection of the programmable multiplexer output lines with circuit 325 is described more completely below. In FIG. 7, the numbers within a programmable multiplexer adjacent to a particular input line represent the state of the architectural cell or cells for which the signal on the particular multiplexer input line is passed through the multiplexer to the output line.

Macrocell mode control generator circuit 325 also includes a plurality of pulse generators PG0 to PG10. Each pulse generator PGi has an enable terminal, a clock terminal, and a pulse output terminal. When the signal on the enable terminal is active and a signal on the clock terminal goes active, pulse generator PGi generates a pulse having a predetermined width on the pulse output terminal. Specifically, the pulse generator provides a narrow pulse that occurs at the leading edge of the pulse on the clock terminal. While in this embodiment pulse generators are utilized, those other techniques used to generate a pulse are described in copending, commonly filed, and commonly assigned U.S. patent application Ser. No. 08/458,865, entitled "MACROCELL AND CLOCK SIGNAL ALLOCATION CIRCUIT FOR A PROGRAMMABLE LOGIC DEVICE (PLD) ENABLING PLD RESOURCES TO PROVIDE MULTIPLE FUNCTIONS," of Bradley A. Sharpe-Geisler, filed on Jun. 2, 1995, which is incorporated herein by reference in its entirety. As explained more completely in the application of Sharpe-Geisler, the pulse generators described below can have variable sized pulses widths to accommodate differing control and clock signal requirements. For example, an asynchronous reset signal may require a wider pulse width than a clock signal generated using a direct clock input signal.

Control product terminal PT0 drives an inverter 706 which in turn drives a clock terminal of pulse generator PG0. The enable terminal of pulse generator PG0, as well as the enable terminal of each of pulse generators PG1, PG3, PG4, PG6, PG7 and PG10, is tied to the power supply voltage, i.e., a first reference voltage. The signal on the output terminal of pulse generator PG0 drives radical block clock line RADCLK0 and a first input terminal of a dual programmable two-to-one multiplexer 707. As is apparent from the following description, herein a dual programmable two-to one multiplexer is effectively two programmable two-to-one multiplexers with a common architectural configuration cell.

A second input terminal of a dual programmable two-to-one multiplexer 707 is tied to ground, i.e., to a second reference voltage. The signal passed from one of the first and second input terminals to a first output line of multiplexer 707 is determined by the state of architectural cell B8. The signal on the first output line of multiplexer 707 drives a first input terminal of OR gate 708.

Control product-term PT1 drives a clock terminal of pulse generator PG1 and a third input terminal of dual two-to-one multiplexer 707. The fourth input terminal of multiplexer 707 is driven by the signal from the output terminal of pulse generator PG1. The signal passed from one of the third and fourth input terminals to a second output line of multiplexer 707 also is determined by the state of architectural cell B8. The signal on the second output line of multiplexer 707 drives a second input terminal of OR gate 708. The output signal of OR gate 708 drives radical block clock line RADCLK1.

Control product-term PT2 drives the enable terminal of pulse generator PG2. The signal on the output line of multiplexer 701 drives an inverter 711 and a first input terminal of a programmable two-to-one multiplexer 709. The second input terminal of multiplexer 709 is driven by the output signal of inverter 711.

The signal passed through multiplexer 709 to the clock terminal of pulse generator PG2 is determined by the state of architectural cell B9. The signal on the output terminal of pulse generator PG2 drives a first input terminal of OR gate 710.

Control product-term PT3 drives an inverter 712 and a first input terminal of a programmable two-to-one multiplexer 713. The second input terminal of multiplexer 713 is driven by the output signal of inverter 712. The signal passed through multiplexer 713 to the clock terminal of pulse generator PG3 is determined by the state of architectural cell B10. The signal on the output terminal of pulse generator PG3 drives a second input terminal of OR gate 710. The output signal of OR gate 710 drives radical block clock line RADCLK2.

Control product-term PT4 drives an inverter 714 and a first input terminal of a programmable two-to-one multiplexer 715. The second input terminal of multiplexer 715 is driven by the output signal of inverter 714. The signal passed through multiplexer 715 to the clock terminal of pulse generator PG4 is determined by the a signal on the output line of programmable two-to-one multiplexer 734.

A first input terminal of multiplexer 734 is connected to the power supply voltage and a second input terminal is connected to ground. The signal passed through multiplexer 734 is determined by the state of architectural cell B12. The signal on the output terminal of pulse generator PG4 drives a first input terminal of OR gate 718. The output signal of OR gate 718 drives radical block clock line RADCLK3.

A signal on the output line of programmable two-to-one multiplexer 717 drives a second input terminal of OR gate 718. A first input terminal of multiplexer 717 is connected to ground, and a second input terminal is driven by the output signal from pulse generator PG6. The signal passed through multiplexer 717 is determined by the state of the signal on the output line of programmable two-to-one multiplexer 716. A first input terminal of multiplexer 716 is connected to the power supply voltage and a second input terminal is connected to ground. The signal passed through multiplexer 716 is determined by the state of architectural cell B15.

Control product-term PT5 drives the enable terminal of pulse generator PG5. The signal on the output line of multiplexer 702 drives an inverter 720 and a first input terminal of a programmable two-to-one multiplexer 719. The second input terminal of multiplexer 719 is driven by the output signal of inverter 720.

The signal passed through multiplexer 719 to the clock terminal of pulse generator PG5 is determined by the state of architectural cell B11. The signal on the output terminal of pulse generator PG5 drives a third input terminal of OR gate 718, and a first input terminal of OR gate 724.

Control product-term PT6 drives an inverter 721 and a first input terminal of a programmable two-to-one multiplexer 722. The second input terminal of multiplexer 722 is driven by the output signal of inverter 721. The signal passed through multiplexer 722 to the clock terminal of pulse generator PG6 is determined by the a signal on the output line of two-to-one multiplexer 734.

The signal on the output terminal of pulse generator PG6 drives the input terminal of multiplexer 717 as described above, and a first input terminal of a programmable two-to-one multiplexer 723. A second input terminal of multiplexer 723 is connected to ground. The signal passed through multiplexer 723 to a second input terminal of OR gate 724 is determined by the output signal from multiplexer 716, that was described above. The output signal from OR gate 724 drives radical block clock line RADCLK4.

Control product-term PT7 drives invertor 725 which in turn drives a clock terminal of pulse generator circuit PG7. The output signal from pulse generator PG7 drives a first input terminal of OR gate 729.

Control product-term PT8 drives an enable terminal of pulse generator PG8 and a first input terminal of programmable two-to-one multiplexer 726. The output line of multiplexer 703 drives a clock terminal of pulse generator PG9, and an invertor 727, which in turn drives a clock terminal of pulse generator PG8. The output signal from pulse generator PG8 drives a second input terminal of a dual programmable two-to-one multiplexer 728, and a second input terminal of OR gate 729.

First and third input terminals of multiplexer 728 are grounded. The signal passed through multiplexer 728 from one of the first and second input terminals to a first output line, that is connected to a first input terminal of OR gate 730, is determined by the state of the signal from invertor 732.

A first input terminal of a programmable two-to-one multiplexer 705 is connected to the power supply voltage and a second input terminal is connected to ground. The signal passed through multiplexer 705 to an output line, that is connected a second input terminal of multiplexer 726 and to a first input terminal of AND gate 731, is determined by the state of architectural cell B14.

The signal passed through multiplexer 726 to an enable terminal of pulse generator PG9 is determined by the output signal from programmable two-to-one multiplexer 704. A first input terminal of multiplexer 704 is connected to the power supply voltage and a second input terminal is connected to ground. The signal passed through multiplexer 704 to an output line, that is also connected a second input terminal of AND gate 731, is determined by the state of architectural cell B13.

The output signal from AND gate 731 drives invertor 732, which in turn provides a signal select signal to multiplexer 728, as described above. The output signal from pulse generator PG9 drives a fourth input terminal of multiplexer 728 and a second input terminal of OR gate 730.

The signal passed through multiplexer 728 from the third and fourth input terminals to a second output line, that is connected to a third input terminal of OR gate 729, is determined by the state of the signal from invertor 732. The output signal of OR gate 729 drives radical block clock line RADCLK5.

Control product-terminal PT9 drives an inverter 733 which in turn drives the clock terminal of pulse generate PG10. The signal on the output terminal of pulse generator PG10 drives a third input terminal of OR gate 730. The output signal of OR gate 730 drives radical block clock line RADCLK6.

The various radical block clock signals RADCLKi, where i varies from zero to six, generated by this embodiment of macrocell mode control generator circuit 325 can be summarized as follows.

Define:

PIN_CLK[k]=signal passed through global clock multiplexers where k=0 corresponds to multiplexer 701, k=1 corresponds to multiplexer 702, and k=2 corresponds to multiplexer 703.

RAD_CLKj=jth radical block clock signal.

PICKn[a, ..., b]=a fuse selected component of vector [a, ..., b] where index n in PICKn is a unique identifier that corresponds directly to the architectural cell number in FIG. 7 where n ranges from 8 to 14. In some cases, PICKn denotes the selected component of multiple vectors, i.e. PICKn[a, ..., b]=a if and only if PICKn[c, ..., d]=c.

PLG(<enable>, <primary_sig>)=a pulse generator output signals where <enable> is the signal connected to the enable terminal of the pulse generator and <primary_sig> is the signal connected to the clock terminal of the pulse generator.

PTj=the jth control product-term within macrocell mode control generator circuit 325.

PT_PLj=PLG (VCC, PTj) which is the output signal generated by a pulse generator that has the power supply voltage connected to the enable terminal and the jth product-term connected to the clock terminal.

\PT_PLj=PLG (VCC,\PTj)

With these definitions, the seven radical block clock signals are given by:

RADCLK0=/PT_PL0

RADCLK1=PICK8[PT1+/PT_PL0, PT_PL1]

RADCLK2=PICK10[PT_PL3./PR_PL3]+PLG(PT2, PICK9[PIN_CLK[0]./PIN_CLK[0]]).

RADCLK3=PICK12[PT_PL4+PT_PL6./PT_PL4]+ TMP1

RADCLK4=PICK12[PTPL6./PT_PL6]+TMP1

RADCLK5=/PT_PL7+/PICKX[TMP2, TMP3]

RADCLK6=/PT_PL9+/PICKX[TMP2, TMP5]

where

TMP1=PLG(PT5, PICK11[PIN_CLK[1], /PIN_CLK[1]).

TMP2=TMP3*TMP4

TMP3=PLG(PT8./PIN_CLK[2])

TMP4=PLG(PT8, PIN_CLK[2])

TMP5=PLG(PICKY[GNC, VCC, PT8], PIN_CLK[2])

PICKX AND PICKY are controlled by a combination of architectural cells B13 and B14. In PICKX|e,f|, the selection of the first component e corresponds to when architectural cells B13 and B14 are both a logical one. The second component f must be selected for each of the other three configurations of architectural cells B13 and B14, i.e. in each of the other three modes of radical block clocks RADCLK5 and RADCLK6. PICKY|GNC, VCC, PT8| is the mechanism for selecting one of the other three modes. These modes correspond component wise within PICKY to setting (0,0), (0,1), and (1,0) respectively of architectural cells B13, and B14.

Logic Macrocell

Figure 8A:
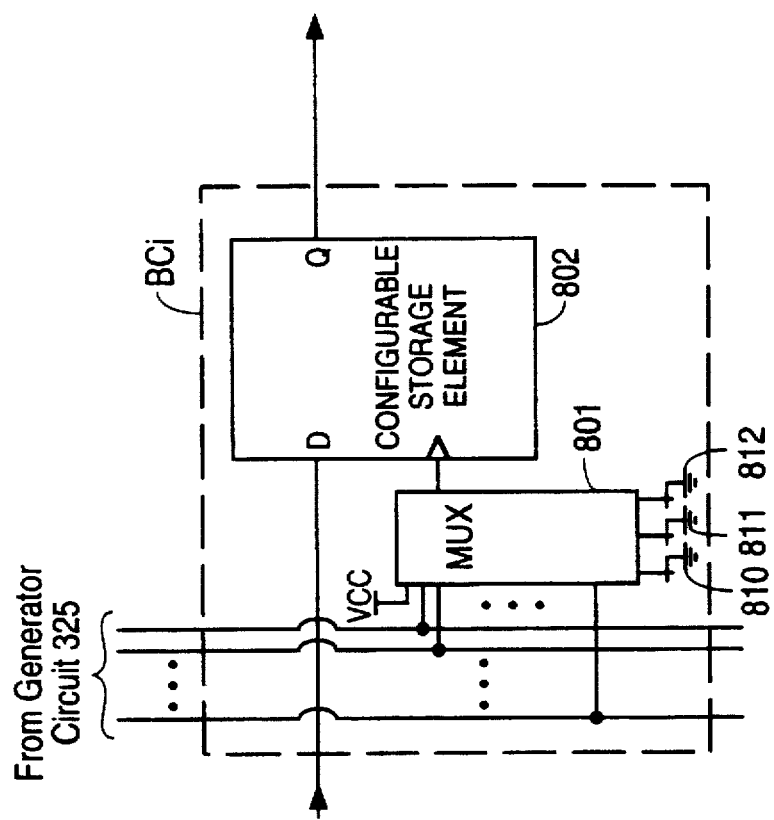
FIG. 8A is a more detailed block diagram of the programmable logic macrocell of this invention.

FIG. 8A is a block diagram of one embodiment of a programmable logic macrocell BCi of this invention. The plurality of radical block clock lines are input lines to a programmable multiplexer 801. In addition to the plurality of radical block clock lines, the power supply voltage is supplied to one input terminal of programmable multiplexer 801. Programmable multiplexer 801 has three architectural cells 810 to 812 that are configured to select one of the input signals for passing through multiplexer 801 to a configuration input/clock terminal of configurable storage element 802.

An input terminal of configurable storage element 802 is connected to an output line of logic allocator 315. An output terminal of configurable storage element 802 drives a macrocell output line and a feedback line to hierarchical switch matrix 160. One embodiment of programmable macrocell is described in copending, commonly filed and commonly assigned U.S. patent application Ser. No. 08/458,865, entitled "MACROCELL AND CLOCK SIGNAL ALLOCATION CIRCUIT FOR A PROGRAMMABLE LOGIC DEVICE (PLD) ENABLING PLD RESOURCES TO PROVIDE MULTIPLE FUNCTIONS," of Bradley A. Sharpe-Geisler, filed on Jun. 2, 1995, which is incorporated herein by reference in its entirety.

The signals on radical block clock lines RADCLK0 to RADCLK6 are used to configure the mode of operation of configurable storage element 802 and to provide clocking signals to configurable storage element 802. For instance, by applying an appropriate clock and mode select signals to multiplexer 801, configurable storage element can be configured in a latch mode, a edge triggered flip-flop mode, or a combinatorial mode. By applying appropriate clock and data signals, configurable storage element 802 can also provide asynchronous reset and preset capability provided in a conventional macrocell without requiring additional circuitry for preset and reset terminals. Unlike conventional macrocells, appropriate signals can be generated on the radical block clock lines to provide dual-edge clocking, clock edge selection, asynchronous clocking, clock enabling, or a mixture of different type clock signals.

The combinatorial mode is selected by passing the power supply voltage through multiplexer 801 to the configuration input/clock terminal of configurable storage element 802. When the power supply voltage is applied to the configuration input/clock terminal of configurable storage element 802, configurable storage element 802 appears transparent to the signal received on the input terminal and so macrocell BCi is configured for combinatorial operation. Thus, the combinatorial mode of operations is independent from the radical block clock signals and is configured locally within each macrocell.

For a latch mode of operation, macrocell mode control generator circuit 325 is configured to generate a radical block clock signal 860 (FIG. 8B) on one of the radical block lines RADCLK0 to RADCLK6. Latch mode clock signal 860 may be allocated to one of the dedicated clock input pins or to an appropriately configured control product-term.

Figure 8B:
FIG. 8B is a trace of a clock signal used with the programmable logic macrocell of this invention.
Figure 8C:
FIG. 8C is a trace of a clock pulses generated by a pulse generator in the macrocell mode control generator circuit of this invention in response to a signal like that illustrated in FIG. 8B.

For an edge-triggered flip-flop mode of operation, macrocell mode control generator circuit 325 is configured to generate a radical block clock signal 864 (FIG. 8C) on one of the radical block lines RADCLK0 to RADCLK6 using one of the pulse generators in circuit 325 in response to a clock signal such as that in FIG. 8B. The narrow pulses in signal 864 are generated by the pulse generator at the leading edge of pulses of clock signal 860 (FIG. 8B). The narrow pulses in signal 864 cause configurable storage element 802 to function in a manner similar to the function of a conventional D-type flip-flop. Specifically, the output signal on output terminal Q of configurable storage element 802 changes states to conform to an input data signal on terminal D only at each positive going edge of the clock signal 860.

Metastability defines a state for a D-type flip-flop where the flip-flop does not accurately generate the appropriate output signal in response to an edge of a clock pulse. For example, for configurable storage element 802, if initially the signal on input terminal is a first level and a clock edge is applied to the configuration input/clock terminal, the output signal should also go to the first level to properly emulate a D-type flip-flop. However, if the clock signal is too broad and the input signal changes state while the clock signal is active, the output signal of element 508 changes state and so element 508 functions as a D-type flip-flop with metastability.

Thus, to assure that configurable storage element 802 functions as a D-type flip-flop without metastability, configurable storage element 802 is configured to operate as a P-type flip-flop. In the present invention, a P-type flip-flop is defined where the P-type flip-flop functions as a D-type flip-flop in response to a clock pulse with an active pulse width less than or equal to a time period ε, and as a latch in response to a clock pulse with an active pulse width greater than time period ε.

Specifically, the output signal on terminal Q of configurable storage element 802 goes to the signal on data input terminal D in response to a leading edge of a radical block clock signal on the configuration input/clock terminal. Configurable storage element 802 holds the output signal for a period of time ε independent of any changes in the signal state on data input terminal D that occur after the leading clock edge. After period of time ε, if the signal on configuration input/clock terminal is still active, i.e., the active portion of the clock signal has a width greater than time period ε, the signal on output terminal Q follows the signal on input terminal D. Thus, to eliminate any metastability problems, time period ε is set to be slightly greater than the active pulse width δ of a clock pulse generated by a pulse generator to provide a D flip-flop mode signal.

Table 1 is a summary of the capabilities provided by the radical block clocks to configurable storage element 802.

TABLE 1

| RADCLK | Latch Enable | Product Term Clock | Pin Clock | Product Term Clock Enable | Sum Clock |
| --- | --- | --- | --- | --- | --- |
| 0 | NA | NA | NA | NA | /PT0 |
| 1 | PT1 | PT1 | NA | NA | /PT0 |
| 2 | NA | PT3 | YES | PT2 | /PT3 |
| 3 | NA | PT4 + PT6 | YES | PT5 | /PT4 + /PT6 |

TABLE 1-continued

| RADCLK | Latch Enable | Product Term Clock | Pin Clock | Product Term Clock Enable | Sum Clock |
|---|---|---|---|---|---|
| 4 | NA | PT6 | YES | PT5 | /PT6 |
| 5 | NA | NA | DUAL EDGE | PT8 | /PT7 |
| 6 | NA | NA | DUAL EDGE | PT8 OR VCC OR GND | /PT9 |

In fitting various user logic to macrocell mode control generator circuit 325, various restrictions can be placed on the fitting process to facilitate development of particular application software in a desired time frame. The particular limitations placed on the fitter for macrocell mode control generator circuit 325 are not an important aspect of this invention. One important aspect of this invention is the use of macrocell mode control generator circuit 325 to both select a mode of operation of the programmable logic macrocell of this invention and provide a wide variety of clock/control combinations including various mixed clocks and the other types of clock/control signals described above.

The radical block clocks in combination with configurable storage element 802 eliminate the need for separate reset and preset input terminals for the storage element in the macrocell as well as the associated logic and architecture bits. According to the principles of this invention, reset and preset for each macrocell in CPLD 100A is emulated in the boolean expressions on a macrocell by macrocell basis.

Figure 9:
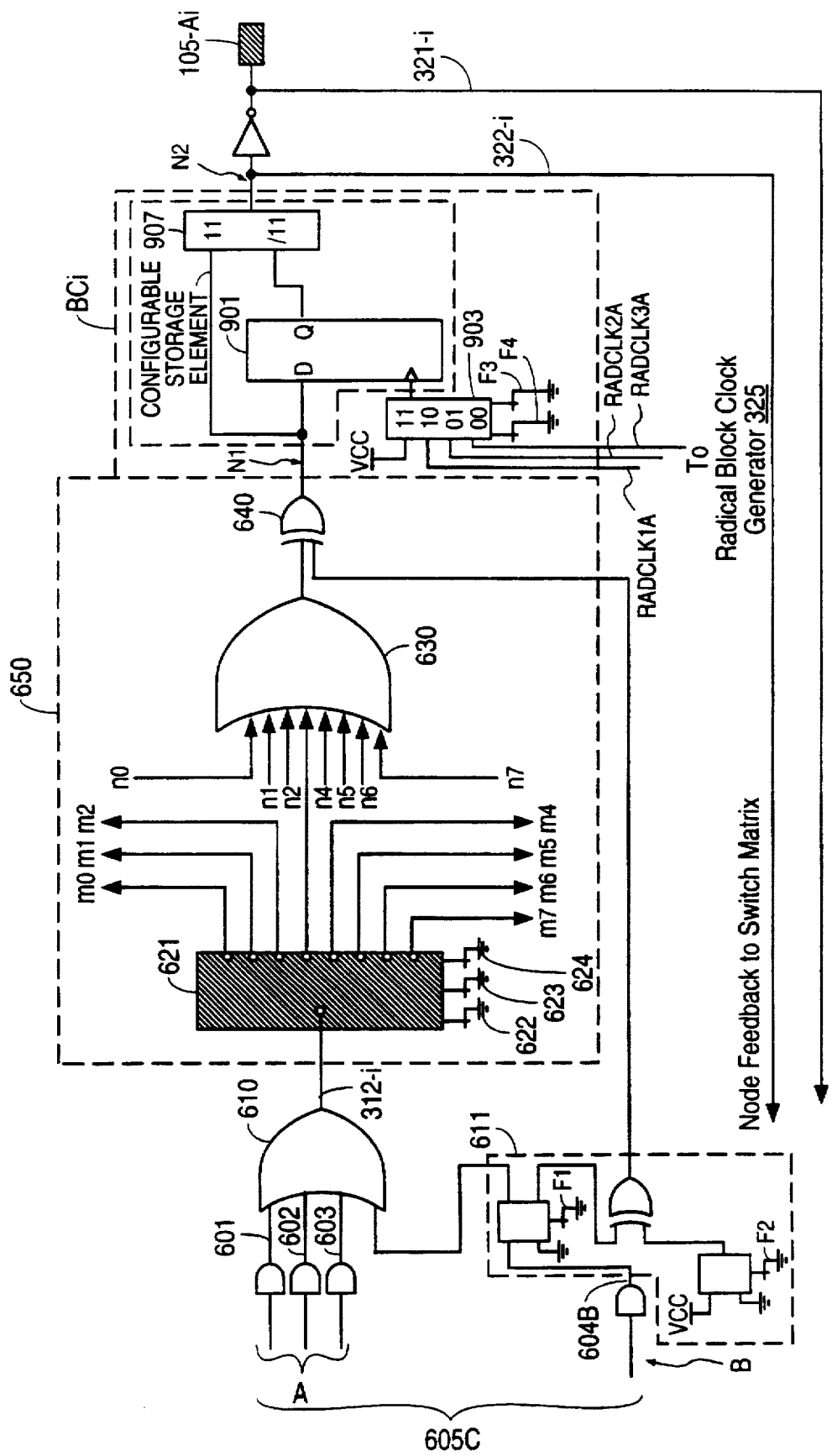
FIG. 9 is a diagram that illustrates one embodiment of the configuration cells, product-term cluster, router element, and programmable logic macrocell that is used to demonstrate the use of the programmable logic macrocell of this invention.

In this embodiment, asynchronous register or latch capability is afforded by forming the logical OR of the reset signal and/or the preset signal with the global clock. Specifically, for a registered or latched signal, the original specified clock signal or latch enable signal CLK, the original specified preset signal P and the original specified reset signal R are logically ORed to form the radical block clock signal, i.e., $RADCLK=CLK+P+R$ The operation of macrocell BCi with radical block blocks RADCLK1Z, RADCLK2Z, and RADCLK3Z (FIG. 9) is demonstrated herein by consideration of a specific example. Again, the architecture used in macrocell BCi of FIG. 9 is intended only to demonstrate the functionality of the macrocell and not to necessarily demonstrate a specific implementation.

Here a Z is added to the reference numeral for a radical block clock line to indicate that the radical block clock signal can be generated by a circuit other than that shown in FIG. 7. In this embodiment, architectural cells F1 to F4 are used with the three radical block clocks to configure macrocell BCi. In this description, the signals at node N1, the input signal to macrocell BCi, and at node N2, the output signal from macrocell BCi are defined. Reference numeral A represents three product terms 601 to 603 and reference numeral B represents product-term 605 in product-term cluster 605B. Herein, the logical operators have the usual definitions. Specifically, +=logic OR
*=logic AND
(+)=exclusive-OR
/=not
x=don't care Table 2 illustrate the input and output signals and the type of output signal when an asynchronous reset or preset is not utilized

TABLE 2

| F1 | F2 | F3 | F4 | N1 | | N2 |
|---|---|---|---|---|---|---|
| 1 | 1 | 1 | 1 | A (+) B | = A*/B+/A*B | Combinatorial |
| 0 | 1 | 1 | 1 | A + B | | Combinatorial |
| 1 | 0 | 1 | 1 | / (A (+) B) | = A*B+/A*/B | Combinatorial |
| 0 | 0 | 1 | 1 | / (A + B) | = /A*/B | Combinatorial |
| 1 | 1 | 0 | 1 | A (+) B | = A*/B+/A*B | Q = D flip-flop using RADCLK3Z |
| 0 | 1 | 1 | 0 | A + B | | Q = D flip-flop using RADCLK2Z |
| 1 | 0 | 0 | 0 | / (A (+) B) | = A*B+/A*/B | Q = D flip-flop using RADCLK1Z |

To configure macrocell BCi (FIG. 9) to emulate a T-type flip flop with a reset signal R, the configuration illustrated in Table 3 is utilized and signals A and B are redefined considering the function of the reset signal.

TABLE 3

| F1 | F2 | F3 | F4 | N1 | | N2 |
|---|---|---|---|---|---|---|
| 1 | 1 | 0 | 0 | A (+) B | = A*/B+/A*B | Q = D flip-flop using RADCLK1Z |

Specifically, for a reset signal, define
A=S*/R
B=Q*/R
RADCLK1Z=CLK+R
where
Q is the feedback signal from the output terminal of a configurable storage element to product-term B;
CLK is the specified clock signal; and
S is the sum-of-product terms A.

Substituting these definitions in the expression for the input signal in Table 3 gives:

$A*/B+/A*B$
$=S*/R*/(Q*/R)+/(S*/R)*Q*/R$
$=S*/R*(/Q+R)+(/S+R)*Q*/R$
$=S*/R*/Q+S*/R*R+/S*Q*/R+R*Q*/R$
$=(S*/Q+/S*Q)*/R$
$=(S(+)Q)*/R$

The last expression is the desired result for a T-type flip flop with a reset signal R.

To configure macrocell BCi emulate a T-type flip flop with a preset signal P, the configuration illustrated in Table 4 is utilized and signals A and B are redefined considering the function of the preset signal

TABLE 4

| F1 | F2 | F3 | F4 | N1 | | N2 |
|---|---|---|---|---|---|---|
| 1 | 0 | 1 | 0 | / (A (+) B) | = A*B+/A*/B | Q = D flip-flop using RADCLK2Z |

Specifically, for a preset signal, define
A=S*/P
B=/Q*/P
RADCLK2=CLK+P
where
CLK is the specified clock signal;

Q is the feedback signal from the output terminal of a configurable storage element to product-term B; and S is the sum-of-product terms A.

Substituting these definitions in the expression for the input signal in Table 4 gives:

A*B+/A*B =S*/P*/Q*/P+/(S*/P)*/(/Q*/P)
=S*/Q*/P+(/S+P)*(Q+P)
=S*/Q*/P+/S*Q+/S*P+P*Q+P*P
=S*/Q*P+/S*Q+P
=S*/Q+/S*Q+P
=(S(+)Q)+P

The last expression shows that the correct result is obtained for a T-type flip flop with a preset signal P.

A D-type flip-flop with a reset R can be emulated in two different ways. First, Table 5 is utilized and input signals A and B are redefined considering the function of the reset signal and a sum of four product terms is used.

TABLE 5

| F1 | F2 | F3 | F4 | N1 | N2 |
|----|----|----|----|------|------------------|
| 0  | 1  | 0  | 0  | A + B | Q = D flip-flop using RADCLK1 |

Specifically, for a reset signal, define

A+B=S*/R

RADCLK1Z=CLK+R where

CLK is the specified clock signal; and

S is the sum of four product terms.

Substituting these definitions in the expression for the input signal in Table 5 gives:

A+B=S*/R

Again, the correct result is obtained.

Second, Table 6 is utilized and input signals A and B are redefined considering the function of the reset signal and the exclusive-OR of a sum of three product terms and product-term B is used.

TABLE 6

| F1 | F2 | F3 | F4 | N1 | | N2 |
|----|----|----|----|------|----------|--------|
| 1  | 1  | 0  | 0  | A (+) B | = A*/B+/A*B | Q = D flip-flop using CLK1 |

Specifically, for a reset signal, define

A=S*/R

B=Y*/R

RADCLK1Z=CLK+R where

CLK is the specified clock signal;

Y is the expression implemented with product-term B; and

S is the sum of three product terms.

Substituting these definitions in the expression for the input signal in Table 6 gives:

A*/B+/A*B =S*/R*/(Y*/R)+/(S*/R)*Y*R
=S*/R*(/Y+R)+(/S+R)*Y*/R
=S*/R*/Y+S*/R*R+/S*Y*/R+R*Y*/R
=(S*/Y+/S*Y)*/R
=(S(+)Y)*/R

The last expression is the correct result.

A D-type flip-flop with a preset P also can be emulated in two different ways. First, Table 7 is utilized and input signals A and B are redefined considering the function of the reset signal and a sum of only three product terms is used. The fourth product-term is consumed.

TABLE 7

| F1 | F2 | F3 | F4 | N1 | N2 |
|----|----|----|----|------|------------------|
| 0  | 1  | 0  | 0  | A + B | Q = D flip-flop using RADCLK1 |

Specifically, for a preset signal, define:

A=S

B=P

RADCLK1=CLK+P where

CLK is the specified clock signal; and

S is the sum of three product terms.

Substituting these definitions in the expression for the input signal in Table 7 gives S+P which is the desired result.

Second, Table 8 is utilized and input signals A and B are redefined considering the function of the preset signal and the exclusive-OR of a sum of three product terms and an expression implemented with inverted product-term B.

TABLE 8

| F1 | F2 | F3 | F4 | N1 | N2 |
|----|----|----|----|------------------|----------|
| 1  | 0  | 1  | 0  | / (A (+) B) = A*B*/A*/B | Q = D flip-flop using CLK2 |

For a preset signal define:

A=S*/P

B=/Y*/P

RADCLK2=CLK+P where

CLK is the specified clock signal;

Y is the expression implemented with the inverse of product-term B; and

S is the sum of three product terms.

Substituting these definitions in the expression for the input signal in Table 8 gives:

A*B+/A*/B =S*/P*/Y*/P+/(S*/P)*/(/Y*/P)
=S*/Y*/P+(/S+P)*(Y+P)
=S*/Y*/P+/S*Y+/S*P+P*Y+P*P
=S*/Y*/P+/S*Y+P
=S*/Y+/S*Y+P
=(S(+)Y)+P

The last expression is the desired result.

As described above and illustrated in FIG. 7, rather than just three radical block clock lines, multiple radical block clock lines are provided. Thus, if the reset or preset function is not desired on an individual macrocell, a radical block clock line can be chosen which does not have the reset or preset ORed with the clock.

I/O Cell

I/O cell IOCi of this invention is illustrated in FIG. 10. I/O cell IOCi has a single three-state buffer 1040 coupled to I/O pin 1041. The input terminal of three-state buffer 1040 is connected to output line from a logic macrocell BCi. The control terminal of buffer 1040 is connected to the output line of a four-to-one programmable multiplexer 1042. The output terminal of buffer 1040 is also coupled to hierarchical switch matrix 160.

Two output enable product terms are connected to the first two inputs of four-to-one multiplexer 1042. The third input terminal is tied to power supply voltage $V_{cc}$ and the fourth terminal is grounded. Multiplexer 1042 selectively provides an output enable signal to buffer 1040.

Four-to-one multiplexer 1042 has two architectural cells 1043, 1044. When first cell 1043 is programmed to a logic 0 and second cell 1044 is programmed to a logic 1, the first output enable product-term is supplied to the control terminal of tristate buffer 1040. When both architectural cells 1043, 1044 are programmed to a logic 1, the second output enable product-term is supplied to the output control terminal of tristate buffer 1040. When architectural cell 1043 is programmed to a logic 1 and cell 1044 to a logic 0, power supply voltage $V_{cc}$ is supplied to the terminal of buffer 1040 and when both of the architectural cells 1043, 1044 are programmed to a logic 0 the terminal of tristate buffer 1040 is grounded.

When power supply voltage $V_{cc}$ is supplied to tristate buffer 1040, buffer 1040 is permanently enabled for use as an output buffer and conversely when the control terminal is grounded, buffer 1040 is tristated so that I/O pin 1041 functions permanently as an input pin. When either of the output enable terms is applied to the control terminal, the I/O pin functions as a bidirectional I/O pin which is controlled by the applied product-term.

The two product terms are common to up to sixteen I/O cells 330. The two product terms permit the sixteen I/O cells 330 to be configured as two separate banks within I/O macrocells 330. One of the product terms controls the first bank of I/O macrocells and the other product-term controls the second bank of I/O macrocells. An important feature of the I/O cell structure of this invention is that this structure decouples logic macrocells 320 from I/O pins 105-A.

The embodiments described above are only illustrative of the principles of this invention and are not intended to limit the invention to the particular embodiments described. In view of these disclosures, the CPLDs described above could be implemented with segments of a smaller size with a corresponding adjustment to the hierarchical switch matrix. Further, the hierarchical switch matrix may be implemented with a wide variety of programmable multiplexer sizes.

We claim:

1. A method for providing a plurality of hierarchical signal paths in a very high-density complex programmable logic device hereinafter CPLD, said method comprising:

utilizing only first hierarchical level resources of a first hierarchical level circuit for a first hierarchical level signal path within said CPLD; and utilizing only second hierarchical level resources of a second hierarchical level circuit and said first hierarchical level resources for a second hierarchical level signal path within said CPLD wherein said second hierarchial level resources are connected to said first hierarchical level resources.

2. A method as in claim 1 wherein utilizing only first hierarchical level resources of a first hierarchical level circuit for a first hierarchical level signal path further comprises:

utilizing a programmable logic block having a plurality of input lines and a plurality of output lines; and utilizing a programmable block switch matrix connected to said plurality of input lines of said programmable logic block.

3. A method claim 2 wherein said utilizing only second hierarchical level resources of a second hierarchical level circuit and said first hierarchical level resources for a second hierarchical level signal path further comprises:

utilizing a programmable segment switch matrix connected to a plurality of input lines of said programmable block switch matrix.

4. A method as in claim 1 further comprising:

utilizing third hierarchical level resources of a third hierarchical level circuit, said second hierarchical level resources, and said first hierarchical level resources for a third hierarchical level signal path within said CPLD wherein said third hierarchial level resources are connected to said second hierarchical level resources.

5. A method as in claim 4 wherein utilizing only first hierarchical level resources of a first hierarchical level circuit for a first hierarchical level signal path further comprises:

utilizing a programmable logic block having a plurality of input lines and a plurality of output lines; and utilizing a programmable block switch matrix connected to said plurality of input lines of said programmable logic block.

6. A method claim 5 wherein said utilizing only second hierarchical level resources of a second hierarchical level circuit and said first hierarchical level resources for a second hierarchical level signal path further comprises:

utilizing a programmable segment switch matrix connected to a plurality of input lines of said programmable block switch matrix.

7. A method as in claim 6 wherein utilizing third hierarchical level resources of a third hierarchical level circuit, said second hierarchical level resources, and said first hierarchical level resources for a third hierarchical level signal path further comprises:

utilizing a programmable global switch matrix having global switch matrix lines programmably connected to and disconnected from lines of said programmable segment switch matrix.

8. A method for defining hierarchical levels of a very high-density complex programmable logic device, hereinafter CPLD, comprising:

defining a first hierarchical level of said CPLD as including a signal path through a first programmable logic block and a first programmable block switch matrix connected to a plurality of input lines of said first programmable logic block; and defining a second hierarchical level of said CPLD as a signal path through a second programmable logic block, a second programmable block switch matrix connected to a plurality of input lines of said second programmable logic block, and a first programmable segment switch matrix connected to input lines of said first and second programmable block switch matrices wherein a signal path through said second programmable block switch matrix and said second programmable logic block are in said first hierarchical level of said CPLD.

9. A method for defining hierarchical levels of a CPLD as in claim 8 further comprising:

defining said first hierarchical level of said CPLD to further include a signal path through a third programmable logic block and a third programmable block switch matrix connected to a plurality of input lines of said third programmable logic block wherein a signal path through said third programmable block switch matrix and said third programmable logic block are in said first hierarchical level of said CPLD.

10. A method for defining hierarchical levels of a CPLD as in claim 9 further comprising:

defining said second hierarchical level of said CPLD to further include a signal path through a fourth programmable logic block, a fourth programmable block switch matrix connected to a plurality of input lines of said fourth programmable logic block, and a second programmable segment switch matrix connected to input lines of said third and fourth programmable block switch matrices wherein a signal path through said fourth programmable block switch matrix and said fourth programmable logic block are in said first hierarchical level of said CPLD.

11. A method for defining hierarchical levels of a CPLD as in claim 8 further comprising:

defining said second hierarchical level of said CPLD to further include a signal path through a fourth programmable logic block and a fourth programmable block switch matrix connected to a plurality of input lines of said fourth programmable logic block and a second programmable segment switch matrix connected to input lines of said fourth programmable block switch matrix wherein a signal path through said fourth programmable block switch matrix and said fourth programmable logic block are in said first hierarchical level of said CPLD.

12. A method for defining hierarchical levels of a CPLD as in claim 8 further comprising:

defining a third hierarchical level of said CPLD as including a signal path through a programmable global switch matrix connected to said first segment switch matrix wherein a signal path through first programmable segment switch matrix, said second programmable block switch matrix, and said second programmable logic block are in second hierarchical level of said CPLD.

\* \* \* \* \*

UNITED STATES PATENT AND TRADEMARK OFFICE
CERTIFICATE OF CORRECTION

PATENT NO. : 5,789,939
ISSUE DATE : 8/4/98
INVENTOR(S) : Agrawal, Om P.; Sharpe-Geisler, Bradley It is certified that error appears in the above-identified patent and that said Letters Patent is hereby corrected as shown below:

Col. 16, line 56: Delete "-o" and insert --to--.

Signed and Sealed this

Tenth Day of April, 2001

*Attest:*

NICHOLAS P. GODICI

*Attesting Officer*     *Acting Director of the United States Patent and Trademark Office*